(12) United States Patent
Lin et al.

(10) Patent No.: US 9,361,024 B1
(45) Date of Patent: Jun. 7, 2016

(54) MEMORY CELL PROGRAMMING METHOD, MEMORY CONTROL CIRCUIT UNIT AND MEMORY STORAGE APPARATUS

(71) Applicant: PHISON ELECTRONICS CORP., Miaoli (TW)

(72) Inventors: Wei Lin, Taipei (TW); Yu-Cheng Hsu, Yilan County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 14/594,178

(22) Filed: Jan. 12, 2015

(30) Foreign Application Priority Data

Dec. 12, 2014 (TW) .............................. 103143496 A

(51) Int. Cl.
*G06F 3/06* (2006.01)

(52) U.S. Cl.
CPC .............. *G06F 3/0604* (2013.01); *G06F 3/064* (2013.01); *G06F 3/0652* (2013.01); *G06F 3/0659* (2013.01); *G06F 3/0679* (2013.01)

(58) Field of Classification Search
CPC ..... G06F 3/0604; G06F 3/064; G06F 3/0652; G06F 3/0659; G06F 3/0679
USPC .............. 711/103, 154, 156, 202; 365/185.33
See application file for complete search history.

(56) References Cited

U.S. PATENT DOCUMENTS

| | | | |
|---|---|---|---|
| 7,548,457 B2 | 6/2009 | Kang et al. | |
| 7,768,827 B2 * | 8/2010 | Kang ................. | G11C 11/5628 365/185.03 |
| 8,180,976 B2 * | 5/2012 | Jeong ..................... | G11C 16/10 711/154 |
| 8,706,952 B2 | 4/2014 | Hsu et al. | |
| 9,007,832 B2 * | 4/2015 | Moschiano ........ | G11C 16/3454 365/185.12 |
| 9,159,406 B2 * | 10/2015 | Higashitani ........ | G11C 11/5628 |
| 2007/0150646 A1 * | 6/2007 | Yoon ...................... | G11C 16/10 711/103 |
| 2013/0097364 A1 * | 4/2013 | Cho ................... | G11C 11/5628 711/103 |
| 2013/0132644 A1 * | 5/2013 | Choi ................... | G06F 12/0246 711/103 |
| 2015/0169247 A1 * | 6/2015 | Wang ..................... | G11C 16/22 711/103 |

OTHER PUBLICATIONS

"Office Action of Taiwan Counterpart Application," issued on Mar. 18, 2016, pp. 1-15, in which the listed references were cited.

* cited by examiner

*Primary Examiner* — Stephen Elmore
(74) *Attorney, Agent, or Firm* — Jianq Chyun IP Office

(57) ABSTRACT

A memory cell programming method for a rewritable non-volatile memory module is provided. The method includes grouping physical erasing units of the rewritable non-volatile memory module at least into a first area and a second area, wherein a first programming parameter set is configured initially for writing a first kind of data into the physical erasing units of the first area and the upper physical programming units of the physical erasing units of the first area are not written with data. The method also includes adjusting the first set of programming parameters to obtain a second programming parameter set, and applying the second set of programming parameters to write a second kind of data into the physical erasing units of the second area, wherein the upper physical programming units of the physical erasing units of the second area are not written with data.

36 Claims, 16 Drawing Sheets

| lower physical programming unit | middle physical programming unit | upper physical programming unit |
|---|---|---|
| 0 | 1 | 2 |
| 3 | 4 | 5 |
| 6 | 7 | 8 |
| 9 | 10 | 11 |
| 12 | 13 | 14 |
| ⋮ | ⋮ | ⋮ |
| 255 | 256 | 257 |

FIG. 10

MEMORY CELL PROGRAMMING METHOD, MEMORY CONTROL CIRCUIT UNIT AND MEMORY STORAGE APPARATUS

CROSS-REFERENCE TO RELATED APPLICATION

This application claims the priority benefit of Taiwan application serial no. 103143496, filed on Dec. 12, 2014. The entirety of the above-mentioned patent application is hereby incorporated by reference herein and made a part of this specification.

BACKGROUND

1. Technical Field

The present invention relates to a memory cell programming method, and particularly relates to a memory cell programming method for a rewritable non-volatile memory module, and a memory control circuit unit and a memory storage device using the same.

2. Description of Related Art

The growth of digital cameras, mobile phones, and MP3 players has been rapid in recent years. Consequently, the consumers' demand for storage media has increased tremendously. Since rewritable non-volatile memory has the advantages of being non-volatile, saving power, having a smaller volume, no mechanical structure, and quick reading/writing speed, the rewritable non-volatile memory is most suitable for portable electronic products, such as notebook computers. A solid state disk is a memory storage device using flash memory as a storage medium. For these reasons, flash memory has become a thriving part of the electronic industries.

With the improvement of the semiconductor manufacturing process, the current technology is already capable of developing flash memory modules with memory cells storing plural bits of data. Specifically, data writing (also called programming) of the flash memory module is performed by applying a voltage to a specific terminal point, such as controlling the gate voltage to change the electron quantity of a charge trapping layer in the gate, so as to change a conductive state of a channel of the memory cell to represent different storage states accordingly. For example, taking the multi-level cell (MLC) NAND flash memory as an example, when data on a lower page is 1 and data on an upper page is 1, the control circuit may control the word line control circuit not to change the gate voltage of the memory cell, but keep the storage state of the memory cell as "11." When data on the lower page is 1, and data on the upper page is 0, the word line control circuit may, under the control of the control circuit, change the gate voltage of the memory cell to change the storage state of the memory cell into "10." When data on the lower page data is 0 and data on the upper page is 0, the word line control circuit may, under the control the control circuit, change the gate voltage of the memory cell to change the storage state of the memory cell into "00." When data on the lower page is 0 and data on the upper page is 1, the word line control may, under the control of the control circuit, change the gate voltage of the memory cell, so as to change the storage state of the memory cell into "01." In other words, during data are being read, the control circuit may identify the storage state of the memory cell according to the current gate voltage of the memory cell.

Through the programming procedures, the memory cells become aged due to multiple times of injecting and removing electrons, such that a writing speed of electrons increases and the threshold voltage distribution widens. Thus, after the programming procedure is performed for multiple times, the storage state of the memory cell may not be correctly identified, and an error bit is thus generated. In addition, when the data stored in the same memory cell are read for multiple times, such as hundreds of thousands or even millions of times, it is very likely that the data are read erroneously. It is also possible that the data stored in the physical erasing unit that are read for multiple times become abnormal or missing. This phenomenon is called "read-disturb" by people having ordinary skills in the art. Particularly, the system data, such as firmware codes, file allocation table (FAT), etc., of the flash memory storage system are stored in the flash memory module, and the system data is read at a high frequency during the operation of the flash memory storage system.

Thus, how to use suitable programming parameters to program the memory cells, so as to prevent rapid degradation of the memory cells, and control the electron quantity in the charge trapping layer of the control gate in a preferable way to prevent read-disturb at the same time require the efforts of the artisans of this field.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention provides a memory cell programming method, a memory control circuit unit, and a memory storage device capable of lengthening a lifetime of memory cells and preventing read-disturb.

An exemplary embodiment of the present invention provides a memory programming method for a rewritable non-volatile memory module. The rewritable non-volatile memory module has a plurality of physical erasing units and each of the physical erasing units has a plurality of physical programming units. The memory cell programming method includes: applying a first programming parameter set to write a first kind of data to one of the physical programming units; and applying a second programming parameter set to write a second kind of data to one of the physical programming units. In addition, at least part of parameters of the first programming parameter set differ from the second programming parameter set, and the number of bits of data of a memory cell of the one of the physical programming units written with the first kind of data by applying the first programming parameter set is the same as the number of bits of data of a memory cell of the one of the physical programming units written with the second kind of data by applying the second programming parameter set.

An exemplary embodiment of the present invention provides a memory control circuit unit for accessing a rewritable non-volatile memory module. The memory control circuit unit includes a host interface, a memory interface, and a memory management circuit. The host interface is coupled to a host system. The memory interface is coupled to the rewritable non-volatile memory module. The rewritable non-volatile memory module has a plurality of physical erasing units, and each of the physical erasing units has a plurality of physical programming units. The memory management circuit is coupled to the host interface and the memory interface. The memory management circuit applies a first programming parameter set to write a first kind of data to one of the physical programming units, and applies a second programming parameter set to write a second kind of data to one of the physical programming units. In addition, at least part of parameters of the first programming parameter set differ from the second programming parameter set, and the number of bits of data of a memory cell of the one of the physical programming units written with the first kind of data by applying the first programming parameter set is the same as the number of bits of data of a memory cell of the one of the physical programming units written with the second kind of data by applying the second programming parameter set.

An exemplary embodiment of the present invention provides a memory storage apparatus, including a connecting interface unit, a rewritable non-volatile memory module, and a memory control circuit unit. The connecting interface unit is coupled to a host system. The rewritable non-volatile memory module has a plurality of physical erasing units, and each of the physical erasing units has a plurality of physical programming units. The memory control circuit unit is coupled to the connecting interface unit and the rewritable non-volatile memory module. The memory control circuit unit applies a first programming parameter set to write a first kind of data to one of the physical programming units, and applies a second programming parameter set to write a second kind of data to one of the physical programming units. In addition, at least part of parameters of the first programming parameter set differ from the second programming parameter set, and the number of bits of data of a memory cell of the one of the physical programming units written with the first kind of data by applying the first programming parameter set is the same as the number of bits of data of a memory cell of the one of the physical programming units written with the second kind of data by applying the second programming parameter set.

Based on the above, in the memory cell programming method, the memory control circuit unit, and the memory storage device according to the exemplary embodiments of the present invention, different programming parameters are chosen to write data according to the area where the data are stored. In this way, the lifetime of the memory cell is lengthened, and the storage of important system data is taken into consideration as well.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

To make the above features and advantages of the invention more comprehensible, embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 9-12 are exemplary schematic views illustrating managing a physical erasing unit according an exemplary embodiment.

DESCRIPTION OF THE EMBODIMENTS

Figure 1:
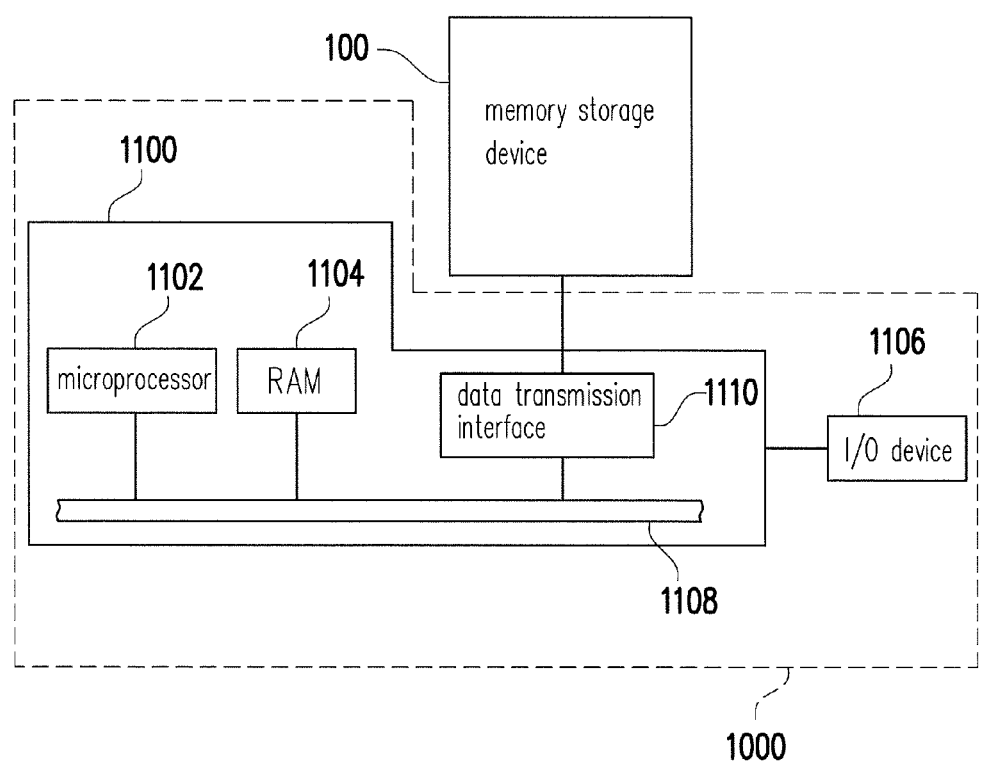
FIG. 1 is a view illustrating a host system and a memory storage device according to an exemplary embodiment.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally speaking, a memory storage device (i.e., a memory storage system) includes a rewritable non-volatile memory module and a controller (i.e., a control circuit). The memory storage apparatus is usually used together with a host system, such that the host system is able to write data into or read data from the memory storage device.

FIG. 1 is a view illustrating a host system and a memory storage device according to an exemplary embodiment.

Referring to FIG. 1, a host system 100 includes a computer 1100 and an input/output (I/O) device 1106. The computer 1100 includes a microprocessor 1102, a random access memory (RAM) 1106, a system bus 1108, and a data transmission interface 1110. The input/output device 1106 includes a mouse 1202, a keyboard 1204, a display 1206, and a printer 1208 shown in FIG. 2, for example. It should be understood that the devices shown in FIG. 2 do not serve to limit the input/output device 1106. The input/output device 1106 may include other devices.

Figure 2:
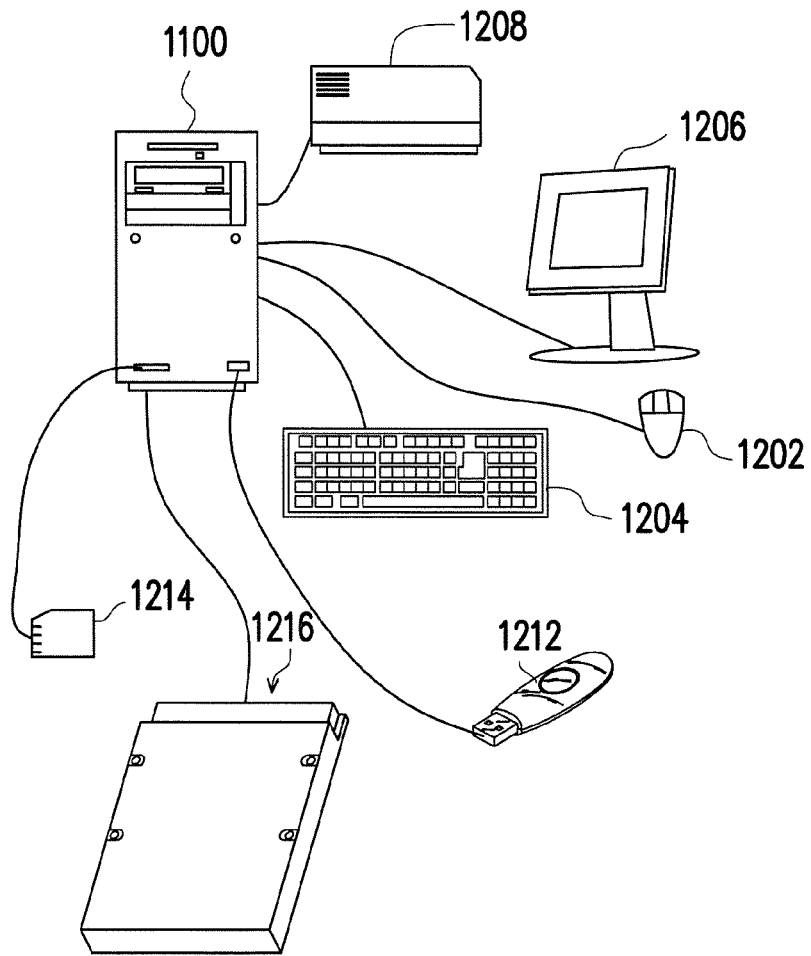
FIG. 2 is a schematic view illustrating a computer, an input/output device, and a memory storage device according to an exemplary embodiment.

In the present embodiment, the memory device 100 is coupled to other devices in the host system 1000 through the data transmission interface 1110. By using the microprocessor 1102, the random access memory 1104, and the input/output device 1106, the data are written to or read from the memory storage device 100. For example, the memory storage device 100 may be a rewritable non-volatile memory device such as a flash drive 1212, a memory card 1214, or a solid state derive (SSD) 1216, etc., as shown in FIG. 2.

Figure 3:
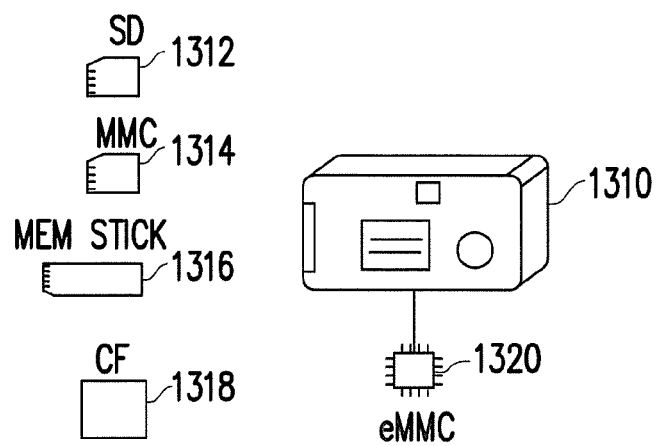
FIG. 3 is a schematic view illustrating a host system and a memory storage device according to an exemplary embodiment.

Generally speaking, the host system 1000 may substantially be any system collocated with the memory storage apparatus 100 for storing data. Even though the host system 1000 is described as a computer system in the present exemplary embodiment, in another embodiment, the host system 1000 may be a system such as a digital camera, a video camera, a communication device, an audio player, or a video player, etc. For example, when the host system 1000 is a digital camera (or video camera) 1310, the rewritable non-volatile memory storage device is a SD card 1312, a MMC card 1314, a memory stick 1316, a CF card 1318, or an embedded storage device 1320 (as shown in FIG. 3). The embedded storage device 1320 includes an embedded MMC (eMMC). It should be mentioned that the eMMC is directly coupled to a substrate of the host system.

Figure 4:
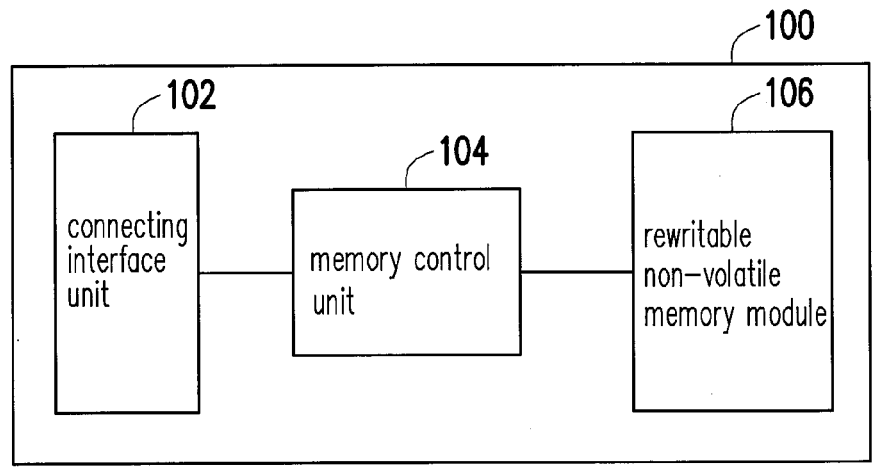
FIG. 4 is a schematic block view illustrating a memory storage device according to an exemplary embodiment.

FIG. 4 is a schematic block view illustrating a memory storage device according to an exemplary embodiment.

Referring to FIG. 4, the memory storage device 100 includes a connecting interface unit 102, a memory control circuit unit 104, and a rewritable non-volatile memory module 106.

In the present exemplary embodiment, the connecting interface unit 102 is compatible with the universal serial bus (USB) standard. However, it should be understood that the invention is not limited thereto. The connection interface unit 102 may be compatible with the parallel advanced technology attachment (PATA) standard, Institute of Electrical and Electronic Engineers (IEEE) 1394 standard, peripheral component interconnect express (PCI Express) standard, secure digital (SD) interface standard, serial advanced technology attachment (SATA) standard, ultra high speed-I (UHS-I) interface standard, ultra high speed-II (USH-II) interface standard, memory stick (MS) interface standard, multimedia card (MMC) interface standard, embedded multimedia card (eMMC) interface standard, universal flash storage (UFS) interface standard, compact flash (CF) interface standard, integrated device electronics (IDE) standard, or other suitable standards.

The memory control circuit unit 104 is configured to perform a plurality of logic gates or control commands implemented in a form of hardware or firmware and perform operations, such as data writing, reading, and erasing operations, in the rewritable non-volatile memory module 106 according to a command of the host system 1000.

The rewritable non-volatile memory module 106 is coupled to the memory control circuit unit 104, and configured to store data written by the host system 1000. Specifically, memory cells of the rewritable non-volatile memory module 106 form a plurality of physical programming units to store data. In present exemplary embodiment, the rewritable non-volatile memory module 106 is a trinary level cell (TLC) NAND flash memory module (i.e., a flash memory module where one memory cell stores three bits of data). However, the present invention is not limited thereto. The rewritable non-volatile memory module 106 may also be a multi-level cell (MLC) NAND flash memory module (i.e., a flash memory module where one memory cell stores two bits of data), other flash memory modules, or other memory modules having the same characteristics.

Figure 5:
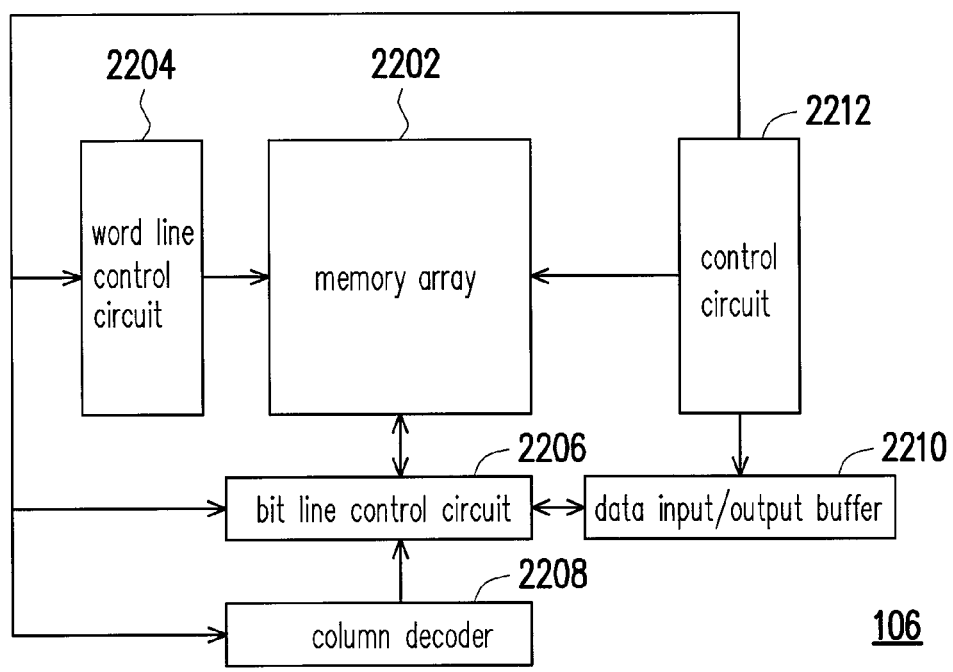
FIG. 5 is a schematic block view illustrating a rewritable non-volatile memory module according to an exemplary embodiment.

FIG. 5 is a schematic block view illustrating a rewritable non-volatile memory module according to an exemplary embodiment.

Referring to FIG. 5, the rewritable non-volatile memory module 106 includes a memory cell array 2202, a word line control circuit 2204, a bit line control circuit 2206, a column decoder 2208, a data input/output buffer 2210, and a control circuit 2212.

Figure 6:
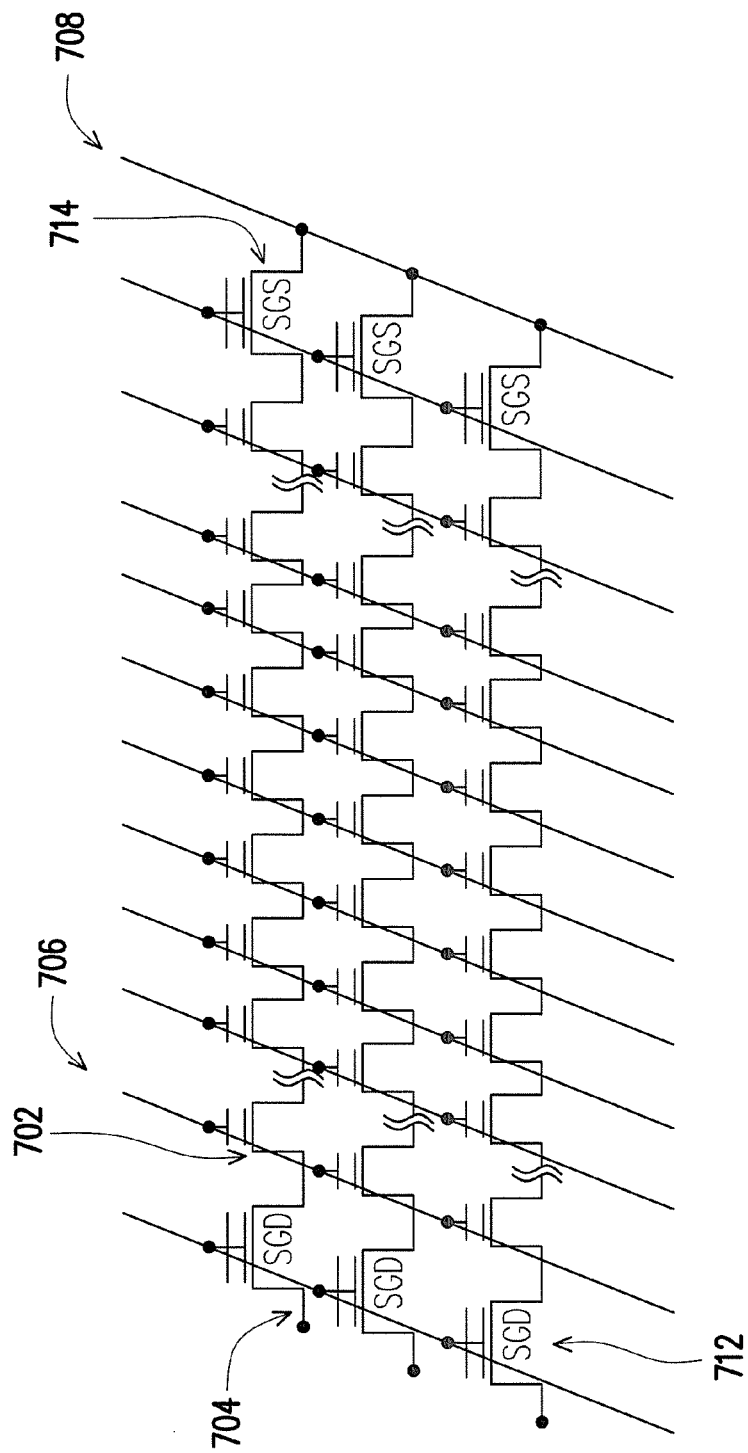
FIG. 6 is a schematic view illustrating a memory cell array according to an exemplary embodiment.

FIG. 6 is a schematic view illustrating a memory cell array according to an exemplary embodiment.

Referring to FIGS. 5 and 6, the memory cell array 2202 includes a plurality of memory cells 702 for storing data, a plurality of select gate drain (SGD) transistors 712, and a plurality of select gate source (SGS) transistors 714, and a plurality of bit lines 702, word lines 706, and common source lines 108 connected to the memory cells 702 (as shown in FIG. 6). The memory cells 702 are arranged as an array at intersecting points of the bit lines 704 and the word lines 706. When the memory control circuit unit 104 receives a write command or a read command, the control circuit 2212 may control the word line control circuit 2204, the bit line control circuit 2206, the column decoder 2208, and the data input/output buffer 2210 to write data to the memory cell array 2202 or read data from the memory cell array 2202. In addition, the word line control circuit 2204 is configured to control a voltage applied to the word lines 706, the bit line control circuit 2206 is configured to control a voltage applied to the bit lines 704, the column decoder 2208 chooses a corresponding bit line according to a decode row address in the command, and the data input/output buffer 2210 is configured to store the data temporarily.

The memory cells in the rewritable non-volatile memory module 106 use a plurality of gate voltages to represent data with a plurality of bits. Data writing (also called programming) of the memory cells in the memory cell array 2202 is performed by applying a voltage to a specific terminal point, such as controlling the gate voltage to change an electron quantity of a charge trapping layer in the gate, so as to change a conductive state of a channel of the memory cell and represent different storage states accordingly.

Figure 7:
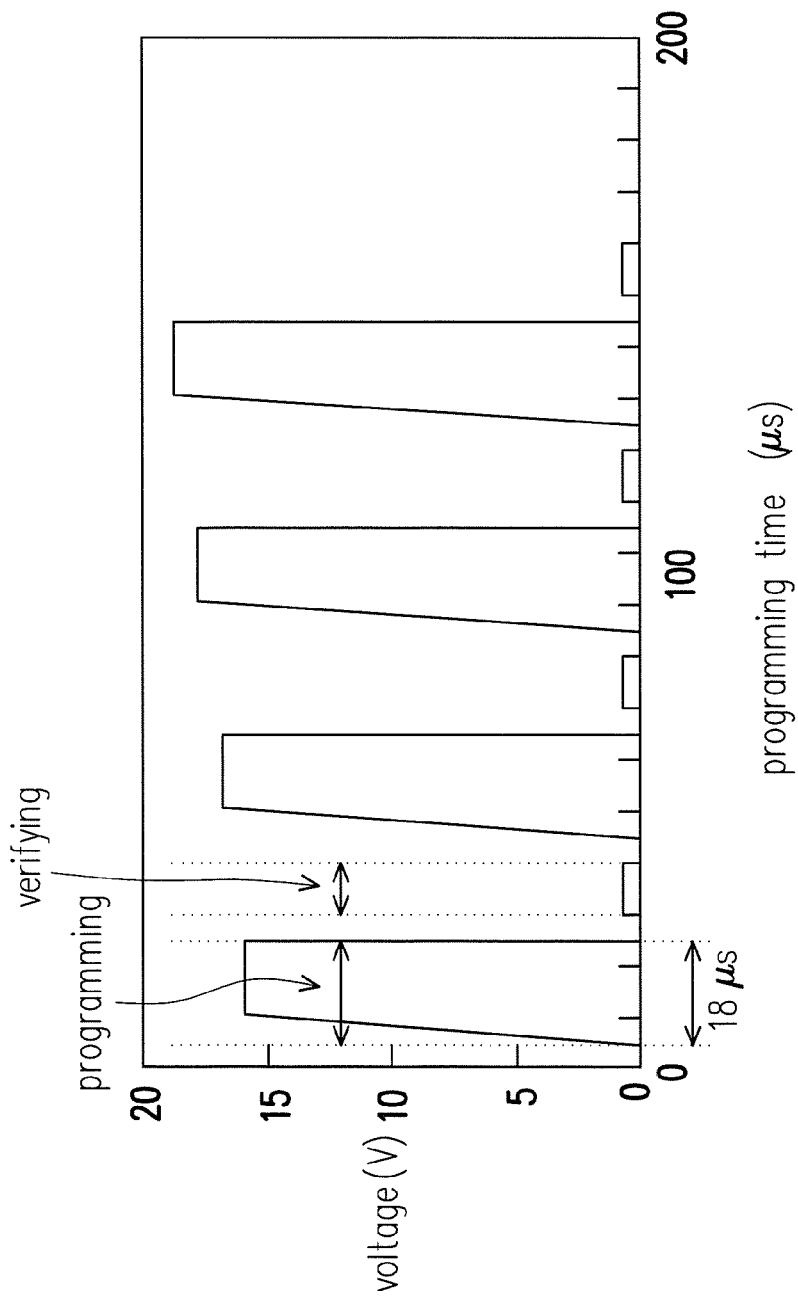
FIG. 7 is a schematic view illustrating programming of a memory cell according to an exemplary embodiment.

FIG. 7 is a schematic view illustrating programming of a memory cell according to an exemplary embodiment.

Referring to FIG. 7, in the present exemplary embodiment, the programming of the memory cells is performed by pulse writing/verifying the threshold voltage. Specifically, when data are to be written to a memory cell, the memory control circuit unit 104 may set an initial writing voltage and a writing voltage pulse time and instruct the control circuit 2212 of the rewritable non-volatile memory module 106 about the initial writing voltage and the writing voltage pulse time that are set to program the memory cell and write the data. Then, the memory control circuit unit 104 uses a verifying voltage to verify the memory cell, so as to determine whether the memory cell is in a correct storage state. If the memory cell is not programmed to the correct storage state, the memory control circuit unit 104 then instructs the control circuit 2212 about an incremental-step-pulse programming (ISPP) adjustment value in addition to the writing voltage currently applied as a new writing voltage (also called repeated writing voltage). Then, the memory cell is programmed again according to the new writing voltage and the writing voltage pulse time. Alternatively, if the memory cell is already programmed to the correct storage state, the data are correctly written to the memory cell. For example, the initial writing voltage is set at 16 V, the writing voltage pulse time is set at 18 μs, and the ISPP adjustment value is set at 0.6V. However, the present invention is not limited thereto.

The reading operation of the memory cell of the memory cell array 2202 is performed by applying a reading voltage at a control gate. A conductive state of the channel of the memory cell (i.e., a path for the memory cell to electrically connect the bit line and the source line, such as a path from a source to a gate of the memory cell) is used to identify data stored in the memory cell.

Figure 8:
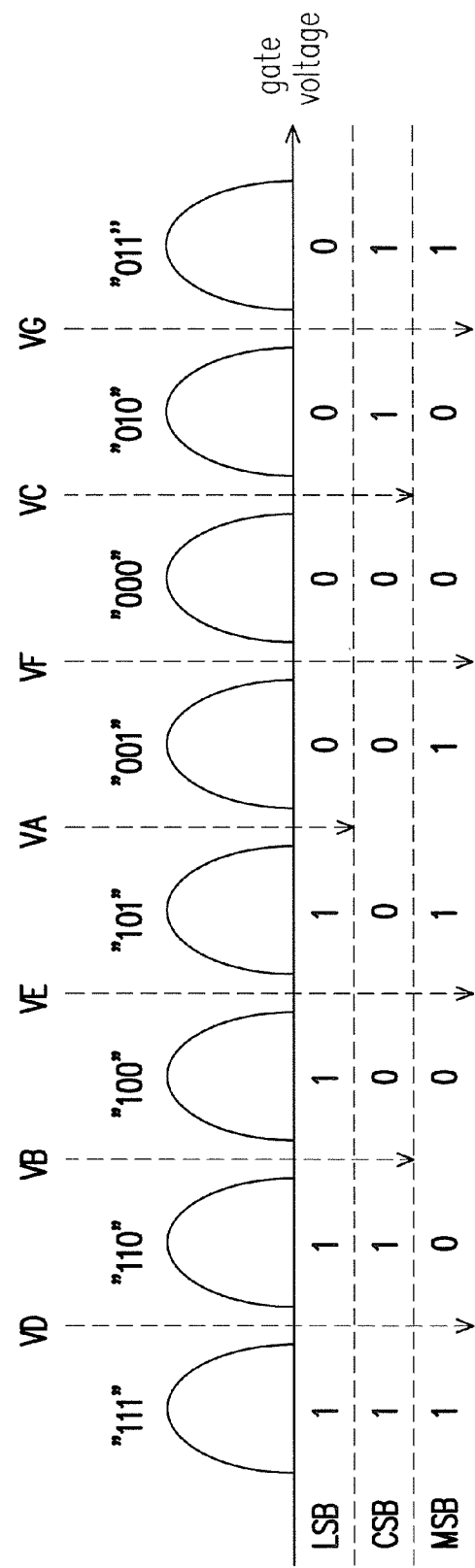
FIG. 8 is a schematic view illustrating reading data from a memory cell according to an exemplary embodiment.

FIG. 8 is a schematic view illustrating reading data from a memory cell according to an exemplary embodiment. Here, a TLC NAND flash memory is used as an example.

Referring to FIG. 8, a storage state of a memory cell in the rewritable non-volatile memory module 106 includes the least significant bit (LSB), namely the first bit from the left side, the center significant bit (CSB), namely the second bit from the left side, and the most significant (MSB), namely the third bit from the left side. In addition, the LSB corresponds to a lower physical programming unit, the CSB corresponds to a middle physical programming unit, and the MSB corresponds to an upper physical programming unit. In this example, the gate voltage of each of the memory cells may be divided into eight storage states (i.e., "111," "110," "100," "101," "001," "000," "010," and "011") according to a first preset reading voltage VA, a second preset reading voltage VB, a third preset reading voltage VC, a fourth preset reading voltage VD, a fifth preset reading voltage VE, a sixth preset reading voltage VF, and a seventh preset reading voltage VG. In particular, several memory cells arranged on the same word line may form three physical programming units. In addition, a physical programming unit formed by the LSBs of the memory cells is the lower physical programming unit, a physical programming unit formed by the CSBs of the memory cells is the middle physical programming unit, and a physical programming unit formed by the MSB of the memory cells is the upper physical programming unit.

FIGS. 9-12 are exemplary schematic views illustrating managing a physical erasing unit according an exemplary embodiment.

Figure 9:
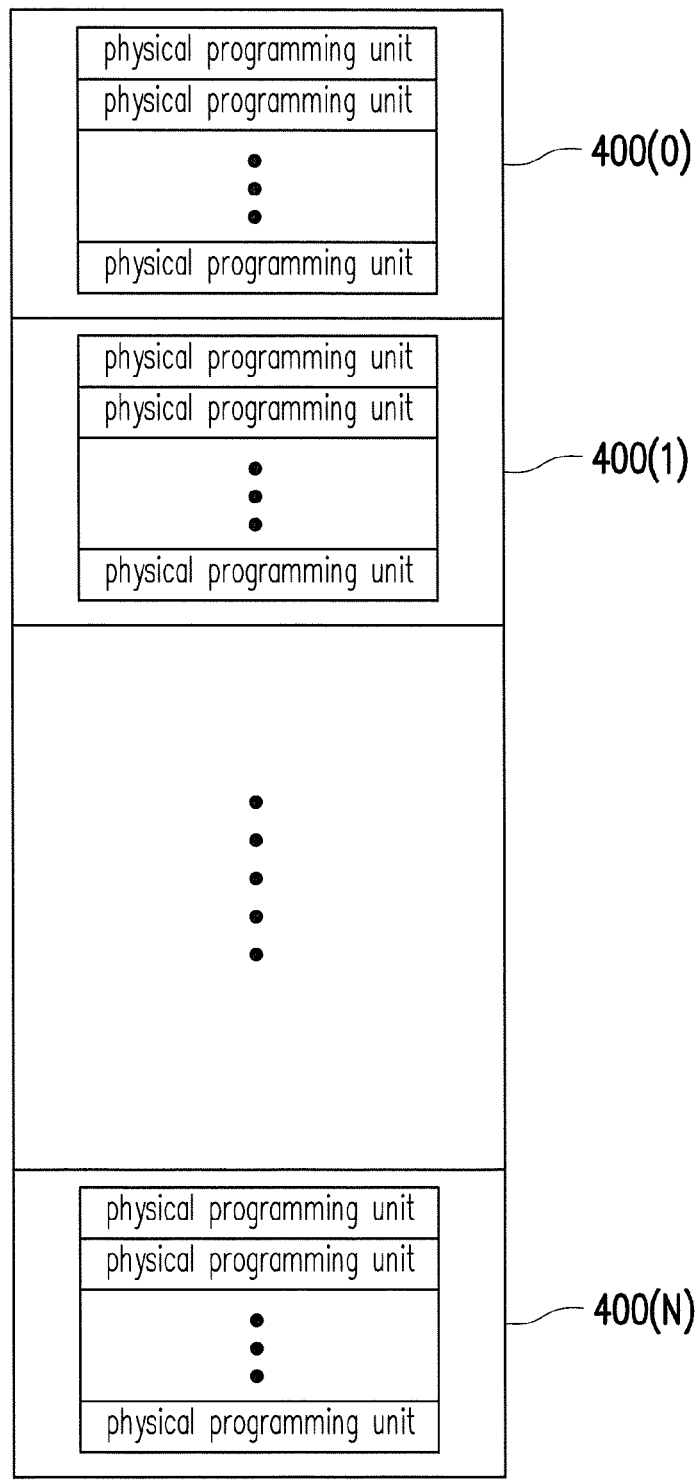

Referring to FIG. 9, the memory control circuit unit 104 (or a memory management circuit 202) performs the writing operation to the memory cells 702 of the rewritable non-volatile memory module 106 by using the physical programming unit as a unit and performs an erasing operation to the memory cells 702 of the rewritable non-volatile memory module 106 by using a physical erasing unit as a unit. Specifically, the memory cells 702 of the rewritable non-volatile memory module 106 form a plurality of the physical programming units, and the physical programming units form a plurality of physical erasing units 400(0) to 400(N). The physical erasing unit is a minimal unit for erasing. In other words, each of the physical erasing units includes a minimum number of memory cells erased together. The physical programming unit is a minimal unit for programming. In other words, the physical programming unit is a minimal unit for data writing. Each of the physical programming units usually includes a data bit area and a redundant bit area. The data bit area includes a plurality of physical access addresses for storing user data, while the redundant bit area is configured to store system data (e.g., control information and error correcting code). Taking the rewritable non-volatile memory module 106 of the TLC NAND flash memory as an example, the LSBs of the memory cells on the same word line form the lower physical programming unit, the CSBs of the memory cells on the same word line form the middle physical programming unit, and the MSBs of the memory cells on the same word line form the upper physical programming unit. In other words, the physical programming units of the physical erasing units in the rewritable non-volatile memory module 106 may be categorized into lower, middle, and upper physical programming units (as shown in FIG. 10).

Figure 11:
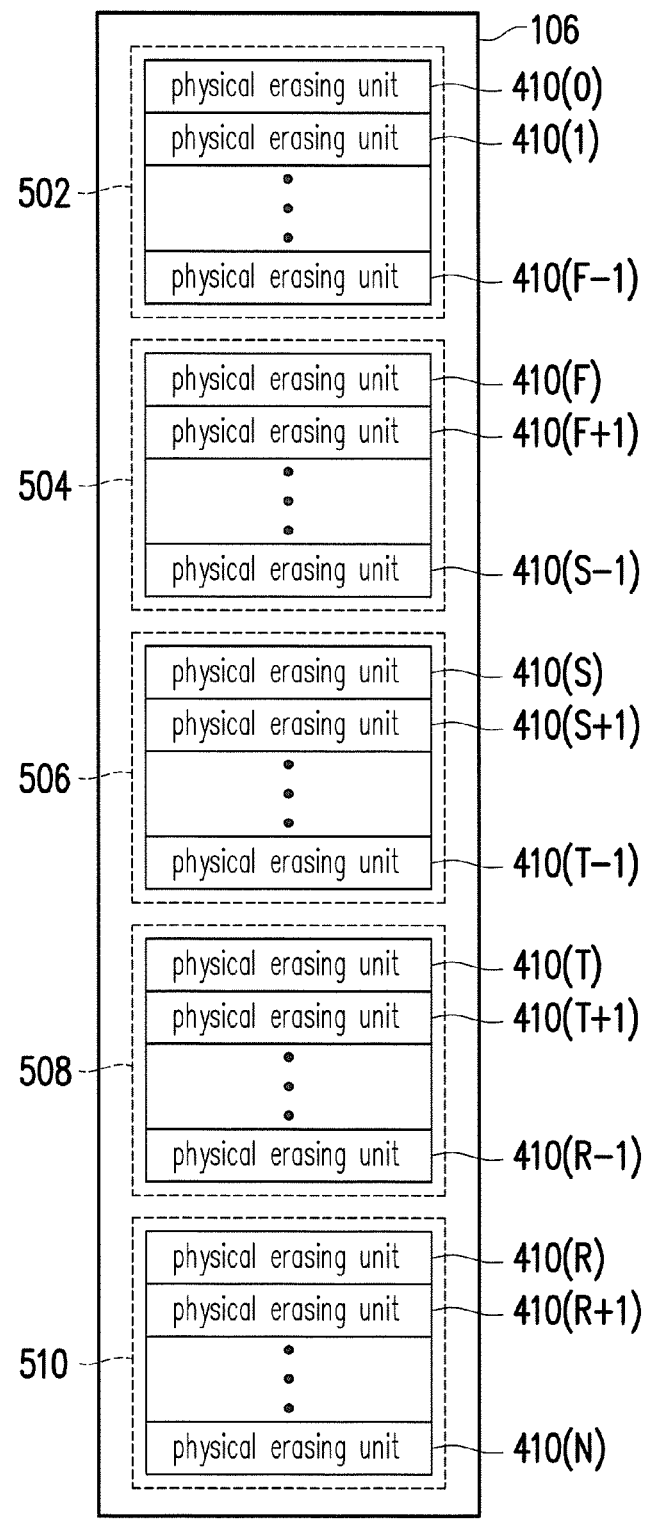

Referring to FIG. 11, in the present exemplary embodiment of the invention, the memory control circuit unit 104 (or the memory management circuit 202) may logically group physical erasing units 410(0) to 410(N) into a data area 502, an spare area 504, a system area 506, a temporary area 508, and a replacement area 510.

The physical erasing units logically belonging to the data area 502 and the spare area 504 are configured to store data from the host system 1000. Specifically, the physical erasing unit of the data area 502 is considered as a physical erasing unit already storing data, and the physical erasing unit in the spare area 504 is considered as the physical erasing unit for replacing the physical erasing unit in the data area 502. In other words, when the host system 100 receives the writing command and data to be written, the memory control circuit unit 104 (or the memory management circuit 202) may get the physical erasing unit from the spare area 504, and write the data to the retrieved physical erasing unit, so as to replace the physical erasing unit in the data area 502.

The physical erasing unit logically belonging to the system area 506 is configured to record the system data. For example, the system data may include a manufacturer and model of the rewritable non-volatile memory module, the number of physical erasing units of the rewritable non-volatile memory module, the number of physical programming units of each of the physical erasing units, and firmware codes of the memory storage device 100.

The physical erasing unit logically belonging to the temporary area serves as a physical erasing unit for temporary storage in a physical erasing unit set for temporary storage corresponding to a logical unit, so as to temporarily store data written by the host system 1000. Details about a method and steps of temporary data storage are described in the following with reference to the drawings.

The physical erasing unit logically belonging to the replacement area 510 is configured in a damaged physical erasing unit replacement operation for replacing a damaged physical erasing unit. Specifically, if there is still a normal physical erasing unit in the replacement area 510 and the physical erasing unit belonging to the data area 502 is damaged, the memory management circuit 202 may get the normal physical erasing unit in the replacement area 510 to replace the damaged physical erasing unit.

Also, the numbers of the data area 502, the spare area 504, the system area 506, and the replacement area 510 may differ as specifications of memories differ. Besides, it should be understood that in an operation of the memory storage device 100, grouping relations of the physical erasing units grouped to the data area 502, the spare area 504, the system area 506, and the replacement area 510 change dynamically. For example, when the physical erasing unit in the spare area 504 is damaged and replaced by the physical erasing unit in the replacement area 510, the physical erasing unit originally associated with the replacement area 510 is associated with the spare area 504.

Figure 12:
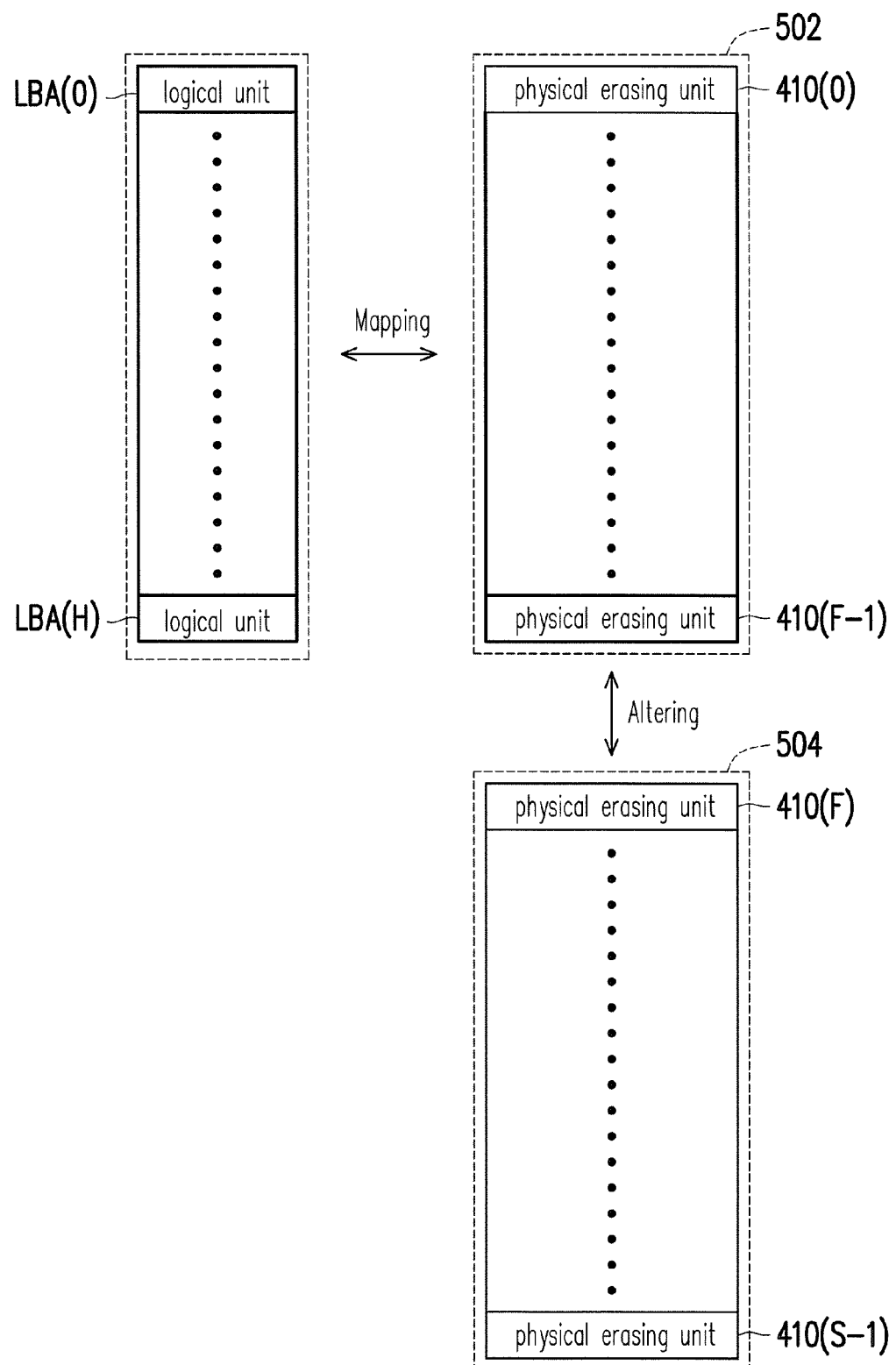

Referring to FIG. 12, in the memory control circuit unit 104 (or the memory management circuit 202), logical units LBA (0) to LBA(H) are configured to map to the physical erasing units in the data area 502. In addition, each of the logical units includes a plurality of logical sub-units to map to the physical programming units of the corresponding physical erasing unit. Also, when the host system 100 intends to write data to the logical unit or update data stored in the logical unit, the memory control circuit unit 104 (or the memory management circuit 202 may get the physical erasing unit from the spare area 504 to write the data, so as to substitute the physical erasing unit in the data area 502. In the present exemplary embodiment, the logical sub-unit may be a logical page or a logical sector.

To identify the physical erasing unit storing the data of each of the logical units, in the present exemplary embodiment, the memory control circuit unit 104 (or the memory management circuit 202) may keep records of mapping between the logical units and physical erasing units. In addition, when the host system 1000 intends to access data from the logical sub-unit, the memory control circuit unit 104 (or the memory management circuit 202) may identify the logical unit that the sub-unit belongs to and send a corresponding command sequence to the rewritable non-volatile memory module 106 to access data from the physical erasing unit mapped to the logical unit. For example, in the present exemplary embodiment, the memory control circuit unit 104 (or the memory management circuit 202) may store a mapping table in the rewritable non-volatile memory module 106 to record the physical erasing unit mapped to each of the logical units. Also, when intending to accessing data, the memory control circuit unit 104 (or the memory management circuit 202) may load the mapping table to the buffer memory 210 for maintenance.

Figure 13:
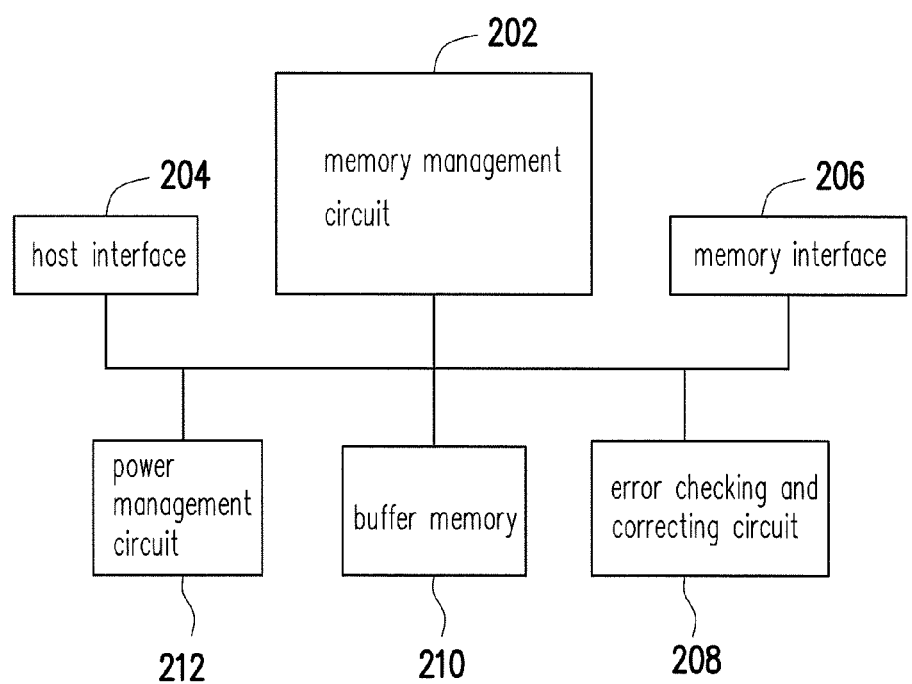
FIG. 13 is a schematic block view illustrating a memory control circuit unit according to an exemplary embodiment.

FIG. 13 is a schematic block view illustrating a memory control circuit unit according to an exemplary embodiment. It should be understood that a structure of the memory control circuit unit shown in FIG. 13 is merely an example, and the present invention is not limited thereto.

Referring to FIG. 13, the memory control circuit unit 104 includes the memory management circuit 202, a host interface 204, a memory interface 206, and an error checking and correcting circuit 208.

The memory management circuit 202 is configured to control the overall operation of the memory control circuit unit 104. Specifically, the memory management circuit 202 has a plurality of control instructions. When the memory storage device 100 is enabled, the control instructions are executed to perform operations such as data writing, reading and erasing operations, etc.

In this embodiment, the control instructions of the memory management circuit 202 are implemented in the form of firmware. For example, the memory management circuit 202 has a microprocessor unit (not shown) and a read-only memory (not shown). Also, the control commands are burnt into the read-only memory.

When the memory storage device 100 is operated, the control commands are executed by the microprocessor for perform the operations such as data writing, reading and erasing operations, etc.

In another exemplary embodiment of the present invention, the control instructions of the memory management circuit 202 may also be stored in a form of programming codes in a specific area of the rewritable volatile memory module 106 (e.g., the system area specifically designated for storing the system data in the memory module, for example). Besides, the memory management circuit 202 has the microprocessor (not shown), a read-only memory (not shown), and a random access memory (not shown). In particular, the read-only memory stores boot codes, and when the memory control circuit unit 104 is enabled, the microprocessor unit firstly executes the boot codes to load the control commands stored in the rewritable non-volatile memory module 106 to the random access memory of the memory management circuit 202. Afterwards, the microprocessor unit executes the control commands for various data operations such as such as data writing, reading and erasing operations, etc.

Also, in another exemplary embodiment, the control instructions of the memory management circuit 202 may also be implemented in the hardware form. For example, the memory management circuit 202 includes a microcontroller, a memory cell management circuit, a memory writing circuit, a memory reading circuit, a memory erasing circuit, and a data processing circuit. The memory cell management circuit, the memory writing circuit, the memory reading circuit, the memory erasing circuit, and the data processing circuit are coupled to the microcontroller. In addition, the memory cell management circuit is configured to manage the physical erasing units of the rewritable non-volatile memory module 106. The memory writing circuit is configured to send the write command to the rewritable non-volatile memory module 106 to write data to the rewritable non-volatile memory module 106. The memory reading circuit is configured to send the read command to the rewritable non-volatile memory module 106 to read data from the rewritable non-volatile memory module 106. The memory erasing circuit is configured to send the erasing command to the rewritable non-volatile memory module 106 to erase data from the rewritable non-volatile memory module 106. The data processing circuit is configured to process data to be written to the rewritable non-volatile memory module 106 and data to be read from the rewritable non-volatile memory module 106.

The host interface 204 is coupled to the memory management circuit 202 and configured to receive and identify commands and data transmitted by the host system 1000. In other words, the commands and data from the host system 1000 are transmitted to the memory management circuit 202 through the host interface 204. In the present exemplary embodiment, the host interface 204 is compatible with the USB standard. However, it should be understood that the invention is not limited thereto.

The host interface 204 may also be compatible with the PATA standard, the IEEE 1394 standard, the PCI Express standard, the SD standard, the SATA standard, the UHS-I interface standard, the UHS-II interface standard, the MS standard, the MMC standard, the eMMC interface standard, the UFS interface standard, the CF standard, the IDE standard, or other suitable data transmission standard.

The memory interface 206 is coupled to the memory management circuit 202 and accesses the rewritable non-volatile memory module 106. In other words, data to be written into the rewritable non-volatile memory module 106 are converted into a format acceptable for the rewritable non-volatile memory module 106 by the memory interface 206.

The error checking and correcting circuit 208 is coupled to the memory management circuit 202 and configured to perform an error correcting operation to ensure the correctness of data. Specifically, when the memory management circuit 202 reads data from the rewritable non-volatile memory module 106, the error checking and correcting circuit 208 performs the error correcting operation to the read data. For example, in the present exemplary embodiment, the error checking and correcting circuit 208 is a low density parity check (LDPC) circuit, and stores a log likelihood ratio (LLR) value look-up table. When the memory management circuit 202 reads data from the rewritable non-volatile memory module 106, the error checking and correcting circuit 208 may perform the error correcting operation according to the read data and a corresponding LLR value in the LLR value look-up table. It should be noted that in another embodiment, the error checking and correcting circuit 208 may also be a turbo code circuit.

In an exemplary embodiment, the memory control circuit unit 104 further includes a buffer memory 210 and a power management circuit 212.

The buffer memory 210 is coupled to the memory management circuit 202 and configured to store the data and commands from the host system 100 or the data from the rewritable non-volatile memory module 106.

The power management circuit 212 is coupled to the memory management circuit 202 and configured to control a power source of the memory storage device 100.

In an exemplary embodiment, when the host system 1000 intends to store data to the logical unit mapped to the data area 502, the memory control circuit unit 104 (or the memory management circuit 202) may temporarily store the data by using the physical erasing unit in the temporary area 508. Specifically, when the host system 1000 receives the write command instructing to store the data to the logical unit, the memory control circuit unit 104 (or the memory management circuit 202) may get several physical erasing units from the temporary area 508 as the physical erasing units for temporary storage corresponding to the logical unit, and temporarily store the data to the lower physical programming units of the physical erasing units for temporary storage in a single-page mode. Then, the memory control circuit unit 104 (or the memory management circuit 202) writes the data stored in the physical erasing units for temporary storage to the corresponding physical erasing unit by using a multi-page mode and map the logical unit to the corresponding physical erasing unit. Here, the data stored to the logical unit mapped to the data area 502 are also termed as the second kind of data or user data.

Here, the single-page mode indicates that the memory cell stores only one bit of data. In other words, for the memory cell capable of storing plural bits of data, the memory control circuit unit 104 (or the memory management circuit 202) only performs the data writing operation to the lower physical programming unit. Since the physical erasing unit for temporary storage is operated in the single-page mode, in the present exemplary embodiment, only one-third of the capacity of one physical erasing unit for temporary storage is used, and the physical erasing unit set for temporary storage corresponding to one logical unit thus includes three physical erasing units for temporary storage to provide sufficient space to store the data of the logical unit. In the present exemplary embodiment of the invention, the memory control circuit unit 104 (or the memory management circuit 202) operates the physical erasing unit in the temporary area 508 by using the single-page mode.

The multi-page mode indicates that the lower, middle and upper physical programming units are used to store data. In other words, when the memory cell capable of storing plural bits writes data in the multi-page mode, the memory control circuit unit 104 (or the memory management circuit 202) programs the lower, middle and upper physical programming units of the physical programming unit set. It should be noted that in an exemplary embodiment, when the physical erasing unit is operated in the multi-page mode, the physical programming units in the same physical programming unit set are programmed at the same time or at different stages. Also, compared with the physical erasing unit operated in the single-page mode, the physical erasing unit operated in the multi-page mode has a shorter lifetime. More specifically, each physical erasing unit only has a limited number of times of being for writing or erasing. When the number of times for writing of the physical erasing unit exceeds a threshold value, the physical erasing unit may be damaged and unable to write data. In addition, the threshold value of the physical erasing unit operated in the multi-page mode is lower than the threshold value of the physical erasing unit operated in the single-page mode. In the present exemplary embodiment, the memory control circuit unit 104 (or the memory management circuit 202) operates the physical erasing unit associated with the data area 502 in the multi-page mode.

In the present exemplary embodiment, when the physical erasing unit is grouped into the temporary area 508, the physical erasing unit is only used in the temporary area 508, and is not used together with the physical erasing units in the spare area 504 and the data area 502. In other words, the memory control circuit unit 104 (or the memory management circuit 202) independently operates the physical erasing units in the temporary area 508 and the spare area 504. For example, when the physical erasing unit is grouped into the temporary area 508, the memory control circuit unit 104 (or the memory management circuit 202) may operate this physical erasing unit in the temporary area 508 in the single-page mode until the physical erasing unit is damaged.

Figure 14:
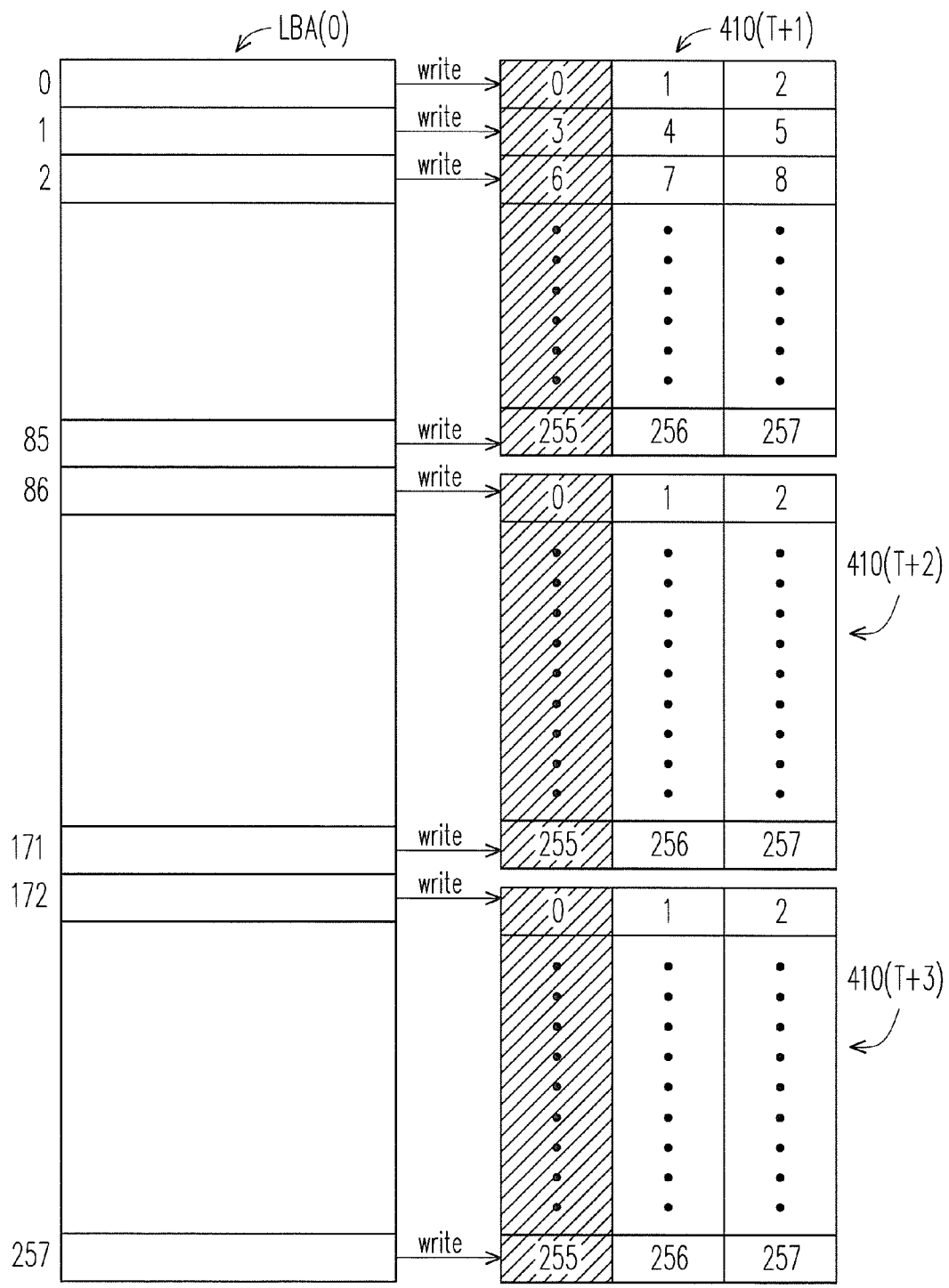
FIG. 14 is a schematic view illustrating an example of temporary storage of data.

FIG. 14 is a schematic view illustrating an example of temporary storage of data.

Referring to FIG. 14, when the memory storage device 100 receives a writing command instructing to store updated data to 0-257th logical sub-units of the logical unit LBA(0), assuming that in the present exemplary embodiment, the memory control circuit unit 104 (or the memory management circuit 202) gets three physical erasing units 410(T+1), 410(T+2), and 410(T+3) as the physical erasing units for temporary storage as the physical erasing units for temporary storage corresponding to the logical unit LBA(0), the memory control circuit unit 104 (or the memory management circuit 202) may use the physical erasing units 410 (T+1), 410(T+2), and 410(T+3) for temporary storage corresponding to the logical unit LBA(0) to write the updated data belonging to the logical unit LBA(0).

For example, the memory control circuit unit 104 (or the memory management circuit 202) may sequentially write the updated data to be stored to the 0 to 85th logical sub-units of the logical unit LBA(0) to the lower physical programming units of the physical erasing unit 410(T+1) for temporary storage, sequentially write the updated data to be stored to the 86 to 171st logical sub-units of the logical unit LBA(0) to the lower physical programming units of the physical erasing unit 410(T+2) for temporary storage, and sequentially write the updated data to be stored to the 172 to 257th logical sub-units of the logical unit LBA(0) to the lower physical programming units of the physical erasing unit 410(T+3) for temporary storage.

In the present exemplary embodiment, after the updated data that the host system 1000 intends to store are written to the physical erasing units 410(T+1), 410(T+2) and 410(T+3) for temporary storage, the memory control circuit unit 104 (or the memory management circuit 202) may send a response that the command is completed to the host system 1000. Then, when the memory storage device 100 idles for a certain period of time (e.g., not receiving any command from the host system 1000 for 30 seconds), or the number of empty physical erasing units in the temporary area 508 and the spare area 504 is less than a preset threshold, the memory control circuit unit 104 (or the memory management circuit 202) may merge valid data belonging to this logical unit from the physical erasing units for temporary storage corresponding to the logical unit to an empty physical erasing unit, and map the logical unit to the physical erasing unit. For example, the preset threshold may be set at 3. Nevertheless, it should be understood that the invention is not limited thereto, so the preset threshold may be other appropriate values. Here, an operation of copying the valid data corresponding to the logical unit from the physical erasing unit set for temporary storage corresponding to the logical unit to the physical erasing unit corresponding to the logical unit in the data area 502 is called a data merging operation.

Figure 15:
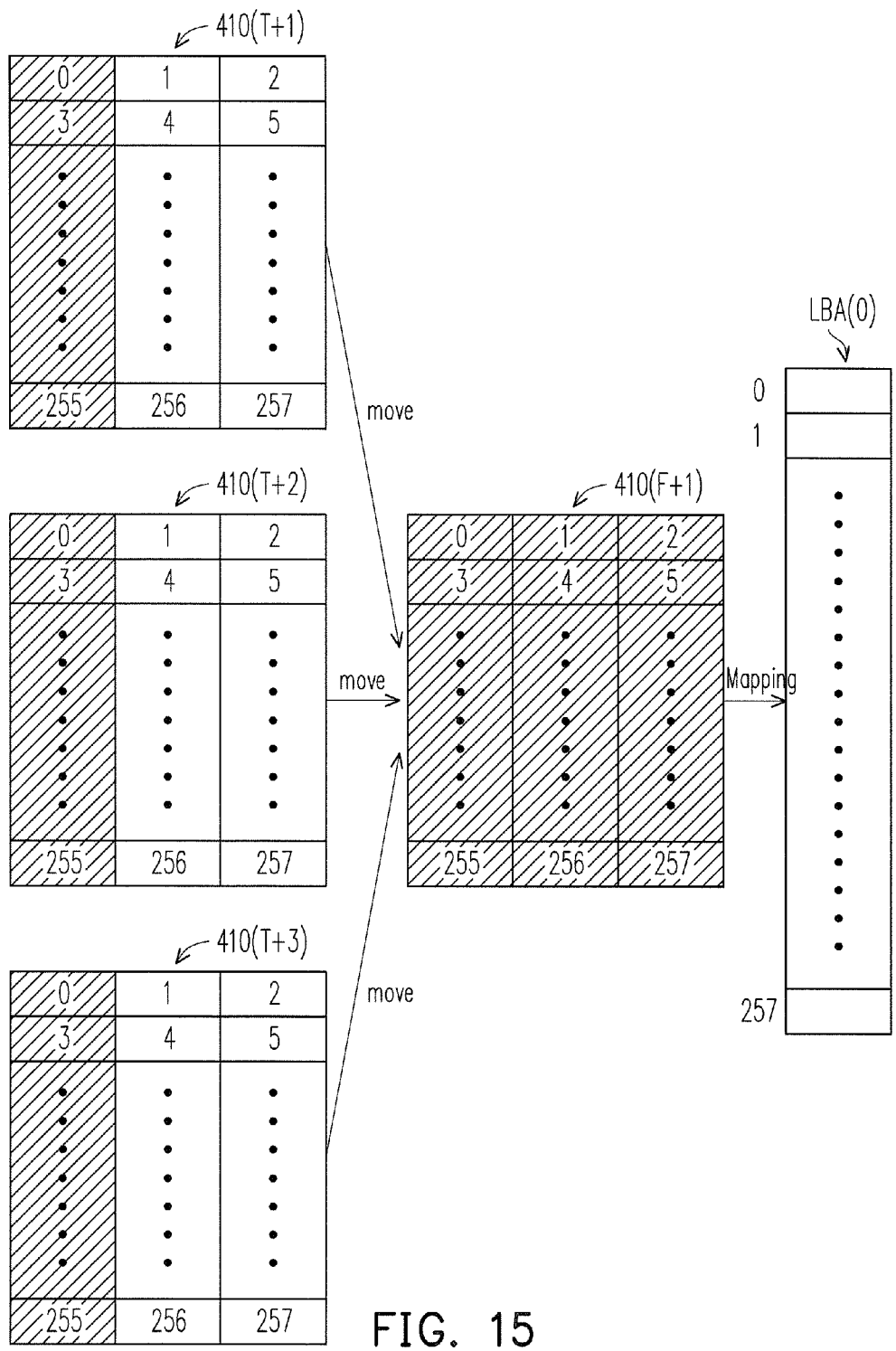
FIG. 15 is a schematic view illustrating an example of a data merging operation.

FIG. 15 is a schematic view illustrating an example of the data merging operation.

Here, it is assumed that the physical erasing units 410(T+1), 410(T+2), and 410(T+3) for temporary storage corresponding to the logical unit LBA(0) already store the valid data of all the logical sub-units of the logical unit LBA(0), as shown in FIG. 7, and the memory management circuit 202 perform is the data merging operation to the logical unit LBA(0).

First of all, as shown in FIG. 15, the memory control circuit unit 104 (or the memory management circuit 202) get the physical erasing unit from the spare area 504 as a substituting physical erasing unit 410(F+1). Specifically, the memory control circuit unit 104 (or the memory management circuit 202) may select an empty physical erasing unit or a physical erasing unit storing invalid data from the spare area 504. In particular, if the physical erasing unit that is gotten is a physical erasing unit storing invalid data, the memory control circuit unit 104 (or the memory management circuit 202) may firstly perform the erasing operation to the physical erasing unit. In other words, the invalid data in the physical erasing unit need to be erased first.

Then, referring to FIG. 15, the memory control circuit unit 104 (or the memory management circuit 202) may copy the valid data belonging to the 0 to 85th logical sub-units of the logical unit LBA(0) from the lower physical programming units of the physical erasing unit 410(T+1) for temporary storage to corresponding pages (e.g., the 0 to 85th physical programming units) of the physical erasing unit 410(F+1). Then, the memory control circuit unit 104 (or the memory management circuit 202) may copy the valid data belonging to the 86 to 171st logical sub-units of the logical unit LBA(0) from the lower physical programming units of the physical erasing unit 410(T+2) for temporary storage to corresponding pages (e.g., the 86 to 171st physical programming units) of the physical erasing unit 410(F+1). Afterwards, the memory control circuit unit 104 (or the memory management circuit 202) may copy the valid data belonging to the 172 to 257th logical sub-units of the logical unit LBA(0) from the lower physical programming units of the physical erasing unit 410(T+3) for temporary storage to corresponding pages (e.g., the 172 to 257th physical programming units) of the physical erasing unit 410(F+1).

It should be noted that, as previously described, the physical erasing unit associated with the data area 502 is operated in the multi-page mode. Thus, the writing operation to the physical erasing unit 410(F+1) is to program by using the physical programming unit set as a unit to program at the same time or at different stages. It should be noted that in an exemplary embodiment, the zeroth, first, and second physical programming units of the physical erasing unit 410(F+1) are programmed at the same time to write the data belonging to the zeroth, first, and second logical sub-units of the logical unit LBA(0), and the third, fourth, and fifth physical programming units of the physical erasing unit 410(F+1) are programmed at the same time to write the data belonging to the third, fourth, and fifth logical sub-units of the logical unit LBA(0).

The same principle applies to the data of other logical sub-units. Thus, the data of logical sub-units are written to the first physical erasing unit 410(F+1) by using the physical programming unit set as a unit.

Finally, the memory control circuit 104 (or the memory management circuit 202) may map the logical unit LBA(0) to the physical erasing unit 410(F+1) in the mapping table, and perform the erasing operation to the physical erasing units 410(T+1) to 410(T+3) for temporary storage corresponding to the logical unit. In other words, when the next writing command is executed, the physical erasing units 410(T+1) to 410(T+3) for temporary storage whose data are already erased are already available to be chosen again as the physical erasing units for temporary storage of the logical unit to be written.

In addition to the temporary area 508, in the present exemplary embodiment, the memory control circuit unit 104 (or the memory management circuit 202) may also operate the physical erasing unit in the system area 506 in the single-page mode.

Specifically, if data stored in the system area 506 (e.g., firmware codes) are lost, the memory storage device 100 is unable to function. Thus, the memory control circuit unit 104 (or the memory management circuit 202) is designed to write data to the lower physical programming unit of the physical erasing unit in the system area 506. For example, a programming parameter set (first programming parameter set hereinafter) including an ISPP adjustment value (first ISPP adjustment value hereinafter), an initial writing voltage (first initial writing voltage hereinafter), a verifying voltage (first verifying voltage hereinafter), a reading voltage (first reading voltage hereinafter), a turn-on voltage (first turn-on voltage hereinafter), and an erasing voltage (first erasing voltage hereinafter) is set in advance to program data to the lower physical programming units of the physical erasing unit in the system area 506. Here, the data to be stored to the logical unit mapped to the physical programming unit in the system area 506 are called the first kind of data or system data.

As noted above, when the memory storage device 100 receives from the host system 100 the data to be stored to the logical unit mapped to the physical erasing unit in the data area 502 (i.e., the writing data received belong to the second kind of data), the memory control circuit unit 104 (or the memory management circuit 202) may use the physical erasing unit in the temporary area 508 operated in the single-page mode to temporarily store the data. For example, in the present exemplary embodiment, the memory control circuit unit 104 (or the memory management circuit 202) may adjust the first programming parameter set configured in default to adjust the physical erasing unit in the system area 506 to generate another programming parameter set (a second programming parameter hereinafter) for the physical erasing unit in the temporary area 508.

In other words, in the present exemplary embodiment, for the system area 506 and the temporary area 508 where each memory cell only stores one bit of data, the memory control circuit unit 104 (or the memory management circuit 202) may separately and respectively use the first and second programming parameter sets to write the first and second kind of data to the corresponding physical programming units.

For example, in an exemplary embodiment, the memory control circuit unit 104 (or the memory management circuit 202) may obtain a voltage as a second verifying voltage of the second programming parameter set by reducing the first verifying voltage of the first programming parameter set.

Figure 16:
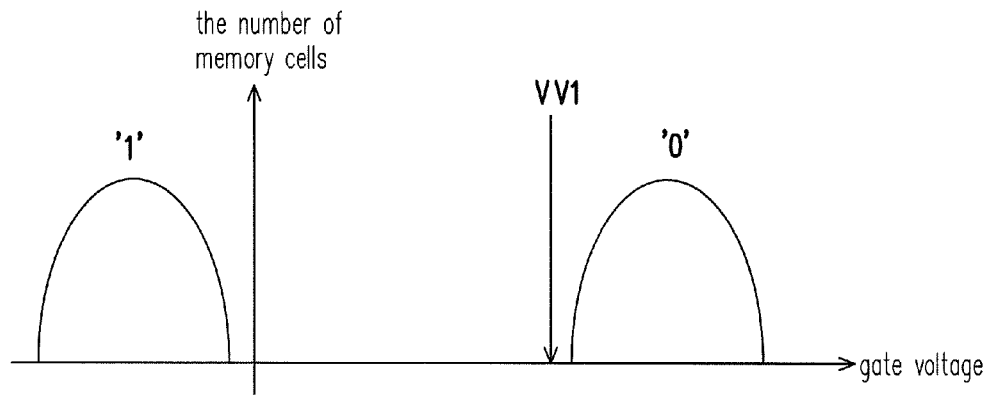
FIG. 16 is a view illustrating a statistic distribution of memory cells in an example of applying a first programming parameter set to program a physical erasing unit in a system area according to an exemplary embodiment.
Figure 17:
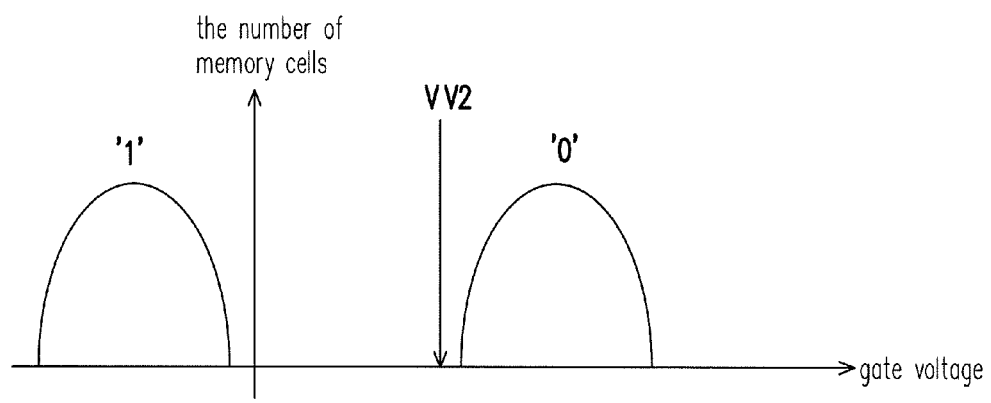
FIG. 17 is a view illustrating a statistic distribution of memory cells in an example of applying a second programming parameter set to program a physical erasing unit in a temporary area according to an exemplary embodiment.

FIG. 16 is a view illustrating a statistic distribution of memory cells in an example of applying a first programming parameter set to program a physical erasing unit in a system area according to an exemplary embodiment, and FIG. 17 is a view illustrating a statistic distribution of memory cells in an example of applying a second programming parameter set to program a physical erasing unit in a temporary area according to an exemplary embodiment.

Referring to FIG. 16, the physical erasing unit of the system area 506 is operated in the single-page mode. Thus, the gate voltage of the memory cells only need to be grouped into two storage states. Since a first verifying voltage VV1 of the first programming parameter set is set at a higher voltage, the memory control circuit unit 104 (or the memory management circuit 202) needs to perform the programming operation for more times when using the first programming parameter set to write data to the physical erasing unit by pulse writing/verifying the threshold voltage. In particular, since the physical erasing unit in the system area 506 stores data that are important and read frequently (e.g., firmware codes), so the first verifying voltage VV1 of the first programming parameter set is set at a higher voltage, so as to clearly distinguish a storage state identified as "1" (i.e., first state) from a storage state identified as "0" (i.e., second state), thereby preventing erroneous identification during reading. In other words, a voltage interval between the first state and the second state in the threshold voltage statistic distribution of the memory cells of the physical programming units programmed with the first programming parameter set is greater than a voltage interval between the first state and the second state in the threshold voltage statistic distribution of the memory cells in the physical programming units programmed with the second programming parameter set. Thus, a data retention capability or an anti-read-disturb capability of the physical programming unit programmed with the first programming parameter set is better than a data retention capability or an anti-read-disturb capability of the physical programming unit programmed with the second programming parameter set.

Referring to FIG. 17, similarly, since the physical erasing unit of the temporary area 508 is operated in the single-page mode, the gate voltage of the memory cells only need to be grouped into two storage states. Particularly, since a second verifying voltage VV2 of the second programming parameter set is lower than the first verifying voltage of the first programming parameter set, the memory cells are able to pass verification of the second verifying voltage VV2 to complete data writing with fewer times of the programming operations when the second programming parameter set is applied to program the data to the physical erasing unit in the temporary area 508 by pulse writing/verifying the threshold voltage. Compared with the physical erasing unit in the system area 506, since the physical unit in the temporary area 506 is able to complete data writing with fewer times of the programming operations, the programming operations have a less significant influence on the physical erasing unit in the temporary area 508. Particularly, since the temporary area 508 is configured to temporarily store data, the physical programming unit in the temporary area 508 is programmed more frequently. Therefore, applying the second programming parameter set with the lower second verifying voltage VV2 is able to effectively lengthen the lifetime of the physical erasing unit in the temporary area 508. Thus, a lifetime of the physical programming unit programmed by applying the second programming parameter set is longer than a lifetime of the physical programming unit programmed by applying the first programming parameter set.

For example, in another exemplary embodiment, the memory control circuit unit 104 (or the memory management circuit 202) may use an ISPP adjustment value obtained by enlarging the first ISPP adjustment value of the first programming parameter set as a second ISPP adjustment value of the second programming parameter set.

Figure 18:
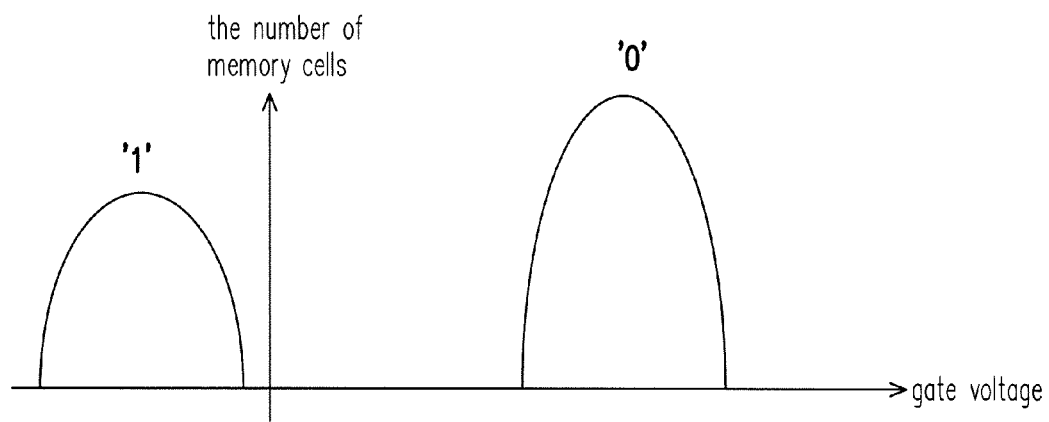
FIG. 18 is a view illustrating a statistic distribution of memory cells in an example of applying a first programming parameter set to program a physical erasing unit in a system area according to another exemplary embodiment.
Figure 19:
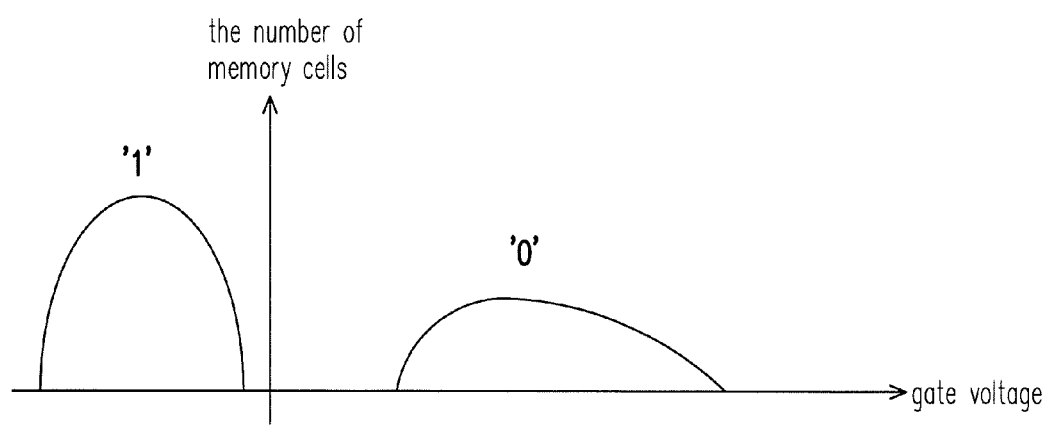
FIG. 19 is a view illustrating a statistic distribution of memory cells in an example of applying a second programming parameter set to program a physical erasing unit in a temporary area according to another exemplary embodiment.

FIG. 18 is a view illustrating a statistic distribution of memory cells in an example of applying a first programming parameter set to program a physical erasing unit in a system area according to another exemplary embodiment, and FIG. 19 is a view illustrating a statistic distribution of memory cells in an example of applying a second programming parameter set to program a physical erasing unit in a temporary area according to another exemplary embodiment.

Referring to FIG. 18, the physical erasing unit of the system area 506 is operated in the single-page mode. Thus, the gate voltage of the memory cells only need to be grouped into two storage states. Since the first ISPP adjustment value of the first programming parameter set is set at a lower value, the memory control circuit unit 104 (or the memory management circuit 202) needs to perform the programming operation for more times to pass verification of the verifying voltage when the first programming parameter set is applied to write data to the programming erasing unit in the system area 506 by pulse writing/verifying the threshold voltage. However, since the first ISPP adjustment value is lower and an amplitude of increase of the writing voltage through each programming operation is less, the electron quantity of the charge trapping layer in the gate is able to be controlled more precisely. Thus, the memory cells of the physical erasing unit in the system area 506 programmed by using the first programming parameter set are able to be programmed to a more correct state and thus effectively prevent read-disturb.

Referring to FIG. 19, similarly, since the physical erasing unit of the temporary area 508 is operated in the single-page mode, the gate voltage of the memory cells only need to be grouped into two storage states. Particularly, since a second ISPP adjustment value of the second programming parameter set is greater than the first ISPP adjustment value of the first programming parameter set, the memory cells are able to pass verification of the verifying voltage to complete data writing with fewer times of the programming operations when the second programming parameter set is applied to program the data to the physical erasing unit in the temporary area 508 by pulse writing/verifying the threshold voltage. Compared with the physical erasing unit in the system area 506, since the physical unit in the temporary area 506 is able to complete data writing with fewer times of the programming operations, the programming operations have a less significant influence on the physical erasing unit in the temporary area 508. Particularly, since the temporary area 508 is configured to temporarily store the data, the physical programming unit in the temporary area 508 is programmed more frequently. Therefore, applying the second programming parameter set with the greater second ISPP adjustment value is able to effectively lengthen the lifetime of the physical erasing unit in the temporary area 508.

It should be noted that FIGS. 16-19 are merely examples of adjusting the first programming parameter set to generate the second programming parameter set. The present invention is not limited thereto. In other exemplary embodiments, the memory control circuit unit 104 (or the memory management circuit 202) may adjust at least one of the first ISPP adjustment value, the first initial writing voltage, the first verifying voltage, the first reading voltage, the first turn-on voltage, and the first erasing voltage to obtain the second ISPP adjustment value, a second initial writing value, the second verifying voltage, a second reading voltage, a second turn-on voltage, and a second erasing voltage of the second programming parameter set.

Figure 20:
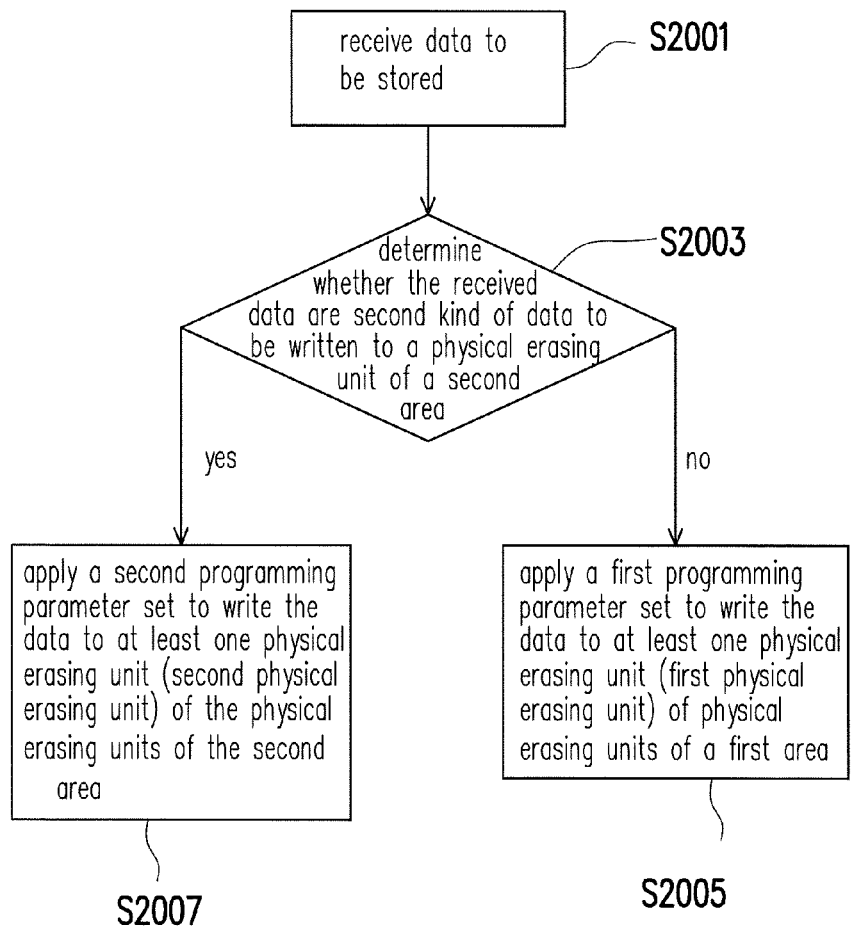
FIG. 20 is a flowchart illustrating a memory cell programming method according to an exemplary embodiment.

FIG. 20 is a flowchart illustrating a memory cell programming method according to an exemplary embodiment.

Referring to FIG. 20, at Step 2001, the memory control circuit 104 (or the memory management circuit 202) receives the data to be stored. For example, the memory storage device 100 may receive from the host system 100 the command and the data corresponding to the command. In addition, the writing command instructs a logic address storing the data.

At Step S2003, the memory control circuit unit 104 (or the memory management circuit 202) determines whether the data received are the second kind of data to be written to the physical erasing unit of the second area (e.g., the temporary area 508). For example, in the present exemplary embodiment, the designated logical unit is mapped to the physical erasing unit of the data area 502. Thus, when the received data is to be stored to the designated logical unit, the memory control unit 104 (or the memory management circuit 202) may identify whether the received data belong to the second kind of data to be temporarily stored to the temporary area 508.

If the received data do not belong to the second kind of data (i.e., data to be written to the physical erasing unit of the first area, such as the system area 506), at Step S2005, the memory control circuit unit 104 (or the memory management circuit 202) may apply the first programming parameter set to write the data to at least one physical erasing unit (first physical erasing unit hereinafter) of the physical erasing units in the first area.

If the received data belong to the second kind of data, at Step S2007, the memory control circuit unit 104 (or the memory management circuit 202) may apply the second programming parameter set to write the data to at least one physical erasing unit (second physical erasing unit hereinafter) of the physical erasing units in the second area.

As previously described, the physical erasing units in the system area 506 and the temporary area 508 are operated in the single-page mode. However, in the present exemplary embodiment, the rewritable non-volatile memory module 106 is a TLC NAND type flash memory, and a multi-layer cell mode erasing command is used before data are written to all the physical erasing units. In other words, in the exemplary embodiment, even though the physical erasing units of the system area 506 and the temporary area 508 are capable of storing three bits of data, the memory control circuit unit 104 (or the memory management circuit 202) applies the first and second programming parameters to operate the physical erasing units in the system area 506 and the temporary area 508. Thus, only the lower physical programming units are used.

It should be noted that, in another exemplary embodiment, the memory control circuit unit 104 (or the memory management circuit 202) may also use a single-layer cell mode erasing command to perform the erase operation to the physical erasing unit in the system area 506 before writing data to the physical erasing unit in the system area 506, such that the physical erasing unit in the system area 506 is only able to store one bit of data. With such operation, the data stored in the physical erasing unit in the system area 506 become more stable and reliable. For example, before data are written to the first physical erasing unit, the memory control circuit unit 104 (or the memory management circuit 202) may use the single-layer cell mode erasing command to perform the erasing operation to the first physical erasing unit, and before data are written to the second physical erasing unit, the memory control circuit unit 104 (or the memory management circuit 202) may use the multi-layer cell mode erasing command to perform the erasing operation to the second physical erasing unit.

In view of the foregoing, in the memory cell programming method, the memory control circuit unit, and the memory storage device provided in the embodiments of the invention, different programming parameters are applied to program the memory cells according to different storage requirements of the system area and the buffer area operated in the single-page mode, so as to prevent read-disturb to the data stored in the system area and prevent rapid degradation of the physical erasing unit in the temporary area. The previously described exemplary embodiments of the present invention have the advantages aforementioned, wherein the advantages aforementioned not required in all versions of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory cell programming method, for a rewritable non-volatile memory module, wherein the rewritable non-volatile memory module has a plurality of physical erasing units, and each of the physical erasing units has a plurality of physical programming units, the memory cell programming method comprising:

applying a first programming parameter set to write a first kind of data to one of the physical programming units; and applying a second programming parameter set to write a second kind of data to one of the physical programming units, wherein at least part of parameters of the first programming parameter set differ from the second programming parameter set, and the number of bits of data of a memory cell of the one of the physical programming units written with the first kind of data by applying the first programming parameter set is the same as the number of bits of data of a memory cell of the one of the physical programming units written with the second kind of data by applying the second programming parameter set.

2. The memory cell programming method as claimed in claim 1, wherein in the physical programming units, the physical programming unit written with the second kind of data is mapped to a corresponding logical address, and the physical programming unit written with the first kind of data is not mapped to a corresponding logical address.

3. The memory cell programming method as claimed in claim 1, wherein the number of bits of the data of the memory cell of the one of the physical programming units written with the first kind of data by applying the first programming parameter set is one, and the number of bits of the data of the memory cell of the one of the physical programming units written with the second kind of data by applying the second programming parameter set is one.

4. The memory cell programming method as claimed in claim 3, further comprising:

at least grouping the physical erasing units into a first area and a second area, wherein the step of applying the first programming parameter sets to write the first kind of data to the one of the physical programming units comprises: applying the first programming parameter set to write the first kind of data to the physical erasing unit belonging to the first area, and the step of applying the second programming parameter set to write the second kind of data to the one of the physical programming units comprises: applying the second programming parameter set to write the second kind of data to the physical erasing unit belonging to the first area.

5. The memory cell programming method as claimed in claim 4, wherein the physical programming units of each of the physical erasing units comprises a plurality of lower physical programming units and a plurality of upper physical programming units, and the first programming parameter set is set in advance to be applied to the physical erasing unit belonging to the first area, and the upper physical programming units of the physical erasing unit in the first area are not used to be programmed with data; and wherein the second programming parameter set is applied to the physical erasing unit in the second area, and the upper physical programming units of the physical erasing unit in the second area are not used to be programmed with data.

6. The memory cell programming method as claimed in claim 5, further comprising:

adjusting the first programming parameter set to obtain the second programming parameter set.

7. The memory cell programming method as claimed in claim 4, further comprising:

receiving data;

determining whether the data belong to the second kind of data;

if the data do not belong to the second kind of data, applying the first programming parameter set to write the data to at least one first physical erasing unit of the physical erasing units of the first area; and if the data belong to the second kind of data, applying the second programming parameter set to write the data to at least one second physical erasing unit of the physical erasing units in the second area.

8. The memory cell programming method as claimed in claim 7, further comprising:

identifying at least one logical unit where the data is to be stored;

determining whether the at least one logical unit is mapped to the physical erasing units in the second area; and if the at least one logical unit is mapped to the physical erasing units in the second area, identifying that the data belong to the second kind of data.

9. The memory cell programming method as claimed in claim 7, further comprising:

using a single-layer cell mode erasing command to perform an erasing operation to the at least one first physical erasing unit; and using a multi-layer cell mode erasing command to perform the erasing operation to the at least one second physical erasing unit.

10. The memory cell programming method as claimed in claim 1, wherein the first programming parameter set comprises at least one of a first incremental-step-pulse programming adjustment value, a first initial writing voltage, a first verifying voltage, a first reading voltage, a first turn-on voltage, and a first erasing voltage.

11. The memory cell programming method as claimed in claim 1, wherein among the physical programming units, a data retention capability or an anti-read-disturb capability of the programming unit programmed with the first programming parameter set is better than a data retention capability or an anti-read-disturb capability of the programming unit programmed with the second programming parameter set.

12. The memory cell programming method as claimed in claim 1, wherein among the physical programming units, a lifetime of the physical programming unit programmed with the second programming parameter set is longer than a lifetime of the physical programming unit programmed with the first programming parameter set.

13. The memory cell programming method as claimed in claim 1, wherein among the physical programming units, a voltage interval between a first state and a second state in a threshold voltage statistic distribution of memory cells of the physical programming units programmed with the first programming parameter set is greater than a voltage interval between the first state and the second state in the threshold voltage statistic distribution of memory cells of the physical programming units programmed with the second programming parameter set.

14. The memory cell programming method as claimed in claim 9, wherein the step of adjusting the first programming parameter set to obtain the second programming parameter set comprises:

adjusting a first verifying voltage of the first programming parameter set to obtain a voltage as a second verifying voltage of the second programming parameter set, wherein the first verifying voltage of the first programming parameter set is greater than the second verifying voltage of the second programming parameter set.

15. The memory cell programming method as claimed in claim 9, wherein the step of adjusting the first programming parameter set to obtain the second programming parameter set comprises:

adjusting a first incremental-step-pulse programming adjustment value of the first programming parameter set to obtain a value as a second incremental-step-pulse programming adjustment value of the second programming parameter set, wherein the first incremental-step-pulse programming adjustment value of the first programming parameter set is less than the second incremental-step-pulse programming adjustment value of the second programming parameter set.

16. The memory cell programming method as claimed in claim 7, wherein the first kind of data are firmware codes and the first area is a system area configured to individually store the firmware codes, and the second kind of data are user data and the second area is a temporary area for temporarily storing the user data.

17. The memory cell programming method as claimed in claim 4, further comprising:

applying the first parameter set to perform an erasing operation to the physical programming unit storing the first kind of data; and applying the second parameter set to perform the erasing operation to the physical programming unit storing the second kind of data.

18. A memory control circuit unit, for accessing a rewritable non-volatile memory module, the memory control circuit unit comprising:

a host interface configured to be coupled to a host system;

a memory interface configured to be coupled to the rewritable non-volatile memory module, wherein the rewritable non-volatile memory module has a plurality of physical erasing units, and each of the physical erasing units has a plurality of physical programming units; and a memory management circuit coupled to the host interface and the memory interface, wherein the memory management circuit applies a first programming parameter set to write a first kind of data to one of the physical programming units and applies a second programming parameter set to write a second kind of data to one of the physical programming units, and at least part of parameters of the first programming parameter set differ from the second programming parameter set, and the number of bits of data of a memory cell of the one of the physical programming units written with the first kind of data by applying the first programming parameter set is the same as the number of bits of data of a memory cell of the one of the physical programming units written with the second kind of data by applying the second programming parameter set.

19. The memory cell control circuit unit as claimed in claim 18, wherein among the physical programming units, the physical programming unit written with the second kind of data is mapped to a corresponding logical address, and the physical programming unit written with the first kind of data is not mapped to a corresponding logical address.

20. A memory storage device, comprising:
a connecting interface unit configured to be coupled to a host system;
a rewritable non-volatile memory module, wherein the rewritable non-volatile memory module has a plurality of physical erasing units, and each of the physical erasing units has a plurality of physical programming units; and
a memory control circuit unit coupled to the connecting interface unit and the rewritable non-volatile memory module,
wherein the memory control circuit unit applies a first programming parameter set to write a first kind of data to one of the physical programming units and applies a second programming parameter set to write a second kind of data to one of the physical programming units, and
at least part of parameters of the first programming parameter set differ from the second programming parameter set, and the number of bits of data of a memory cell of the one of the physical programming units written with the first kind of data by applying the first programming parameter set is the same as the number of bits of data of a memory cell of the one of the physical programming units written with the second kind of data by applying the second programming parameter set.

21. The memory storage device as claimed in claim 20, wherein among the physical programming units, the physical programming unit written with the second kind of data is mapped to a corresponding logical address, and the physical programming unit written with the first kind of data is not mapped to a corresponding logical address.

22. The memory storage device as claimed in claim 20, wherein the number of bits of the data of the memory cell of the one of the physical programming units written with the first kind of data by applying the first programming parameter set is one, and the number of bits of the data of the memory cell of the one of the physical programming units written with the second kind of data by applying the second programming parameter set is one.

23. The memory storage device as claimed in claim 22, wherein the memory control circuit unit at least groups the physical erasing units into a first area and a second area, wherein in the operation of applying the first programming parameter sets to write the first kind of data to the one of the physical programming units, the memory control circuit unit applies the first programming parameter set to write the first kind of data to the physical erasing unit belonging to the first area, and in the operation of applying the second programming parameter set to write the second kind of data to the one of the physical programming units, the memory control circuit unit applies the second programming parameter set to write the second kind of data to the physical erasing unit belonging to the second area.

24. The memory storage device as claimed in claim 23, wherein the first programming parameter set is set in advance to be applied to the physical erasing unit belonging to the first area, and the upper physical programming units of the physical erasing unit in the first area are not used to be programmed with data; and wherein the second programming parameter set is applied to the physical erasing unit in the second area, and the upper physical programming units of the physical erasing unit in the second area are not used to be programmed with data.

25. The memory storage device as claimed in claim 24, wherein the memory control circuit unit adjusts the first programming parameter set to obtain the second programming parameter set.

26. The memory storage device as claimed in claim 25, wherein the memory control circuit unit receives data and determine whether the data are the second kind of data, if the data do not belong to the second kind of data, the memory control circuit unit applies the first programming parameter set to write the data to at least one first physical erasing unit in the physical erasing units of the first area; and if the data belong to the second kind of data, the memory control circuit unit applies the second programming parameter set to write the data to at least one second physical erasing unit in the physical erasing units of the second area.

27. The memory storage device as claimed in claim 25, wherein the memory control circuit unit identifies at least one logical unit of the data to be stored, and determines whether the at least one logical unit is mapped to the physical erasing units in the second area, and if the at least one logical unit is mapped to the physical erasing units in the second area, the memory control circuit unit identifies that the data belong to the second kind of data.

28. The memory storage device as claimed in claim 26, wherein the memory control circuit unit uses a single-layer cell mode erasing command to perform an erasing operation to the at least one first physical erasing unit and uses a multi-layer cell mode erasing command to perform the erasing operation to the at least one second physical erasing unit.

29. The memory storage device as claimed in claim 20, wherein the first programming parameter set comprises at least one of a first incremental-step-pulse programming adjustment value, a first initial writing voltage, a first verifying voltage, a first reading voltage, a first turn-on voltage, and a first erasing voltage.

30. The memory storage device as claimed in claim 25, wherein in the operation of adjusting the first programming parameter set to obtain the second programming parameter set, the memory control circuit unit adjusts a first verifying voltage of the first programming parameter set to obtain a voltage as a second verifying voltage of the second programming parameter set, and the first verifying voltage of the first programming parameter set is greater than the second verifying voltage of the second programming parameter set.

31. The memory storage device as claimed in claim 25, wherein in the operation of adjusting the first programming parameter set to obtain the second programming parameter set, the memory control circuit unit adjusts a first incremental-step-pulse programming adjustment value of the first programming parameter set to obtain a value as a second incremental-step-pulse programming adjustment value of the second programming parameter set, and the first incremental-step-pulse programming adjustment value of the first programming parameter set is less than the second incremental-step-pulse programming adjustment value of the second programming parameter set.

32. The memory storage device as claimed in claim 23, wherein the first kind of data are firmware codes and the first area is a system area configured to individually store the firmware codes, and the second kind of data are user data and the second area is a temporary area for temporarily storing the user data.

33. The memory storage device as claimed in claim 20, wherein the memory control circuit unit applies the first parameter set to perform an erasing operation to the one of the physical programming units storing the first kind of data, and applies the second parameter set to perform the erasing operation to one of the physical programming units storing the second kind of data.

34. The memory storage device as claimed in claim 20, wherein among the physical programming units, a data retention capability or an anti-read-disturb capability of the programming unit programmed with the first programming parameter set is better than a data retention capability or an anti-read-disturb capability of the programming unit programmed with the second programming parameter set.

35. The memory storage device as claimed in claim 20, wherein among the physical programming units, a lifetime of the physical programming unit programmed with the second programming parameter set is longer than a lifetime of the physical programming unit programmed with the first programming parameter set.

36. The memory storage device as claimed in claim 20, wherein among the physical programming units, a voltage interval between a first state and a second state in a threshold voltage statistic distribution of memory cells of the physical programming units programmed with the first programming parameter set is greater than a voltage interval between the first state and the second state in the threshold voltage statistic distribution of memory cells of the physical programming units programmed with the second programming parameter set.

* * * * *